(12) United States Patent
Izutani et al.

(10) Patent No.: US 8,592,844 B2
(45) Date of Patent: Nov. 26, 2013

(54) LIGHT-EMITTING DIODE DEVICE

(75) Inventors: Seiji Izutani, Osaka (JP); Kazutaka Hara, Osaka (JP); Takahiro Fukuoka, Osaka (JP); Hisae Uchiyama, Osaka (JP); Hitotsugu Hirano, Osaka (JP)

(73) Assignee: Nitto Denko Corporation, Osaka (JP)

( * ) Notice: Subject to any disclaimer, the term of this patent is extended or adjusted under 35 U.S.C. 154(b) by 254 days.

(21) Appl. No.: 13/016,594

(22) Filed: Jan. 28, 2011

(65) Prior Publication Data
US 2011/0260185 A1   Oct. 27, 2011

(30) Foreign Application Priority Data

| Jan. 29, 2010 | (JP) | 2010-018256 |
| Apr. 9, 2010 | (JP) | 2010-090908 |
| Jul. 16, 2010 | (JP) | 2010-161848 |
| Jul. 16, 2010 | (JP) | 2010-161850 |
| Jul. 30, 2010 | (JP) | 2010-172327 |

(51) Int. Cl.
*H01L 33/64* (2010.01)

(52) U.S. Cl.
USPC ......... 257/98; 257/99; 257/717; 257/E33.075

(58) Field of Classification Search
USPC ................ 257/97, 98, 717, E33.075
See application file for complete search history.

(56) References Cited

U.S. PATENT DOCUMENTS

| 4,568,592 A | 2/1986 | Kawaguchi et al. |
| 4,960,734 A | 10/1990 | Kanai et al. |
| 6,162,849 A | 12/2000 | Zhuo et al. |
| 6,252,726 B1 * | 6/2001 | Verdiell .................. 359/820 |
| 6,831,031 B2 | 12/2004 | Ishihara |
| 7,170,151 B2 * | 1/2007 | Elpedes et al. ............. 257/676 |
| 7,264,869 B2 | 9/2007 | Tobita et al. |
| 7,513,652 B2 | 4/2009 | Kim |
| 7,602,051 B2 | 10/2009 | Ito et al. |
| 7,718,456 B2 * | 5/2010 | Maeda et al. ................ 438/40 |
| 7,772,692 B2 | 8/2010 | Takamatsu et al. |
| 7,825,422 B2 * | 11/2010 | Maeda et al. ................ 257/98 |
| 7,872,277 B2 | 1/2011 | Hsu et al. |
| 7,973,243 B2 * | 7/2011 | Hatano et al. .......... 174/137 R |
| 8,007,897 B2 | 8/2011 | Ito et al. |

(Continued)

FOREIGN PATENT DOCUMENTS

| JP | 02-192467 | 7/1990 |
| JP | 2002-057442 | 2/2002 |

(Continued)

OTHER PUBLICATIONS

"Lead other companies with a LED bulb", http://it.nikkei.co.jp/business/news/index.aspx?n=MMIT2J000024112009, 2010, 5 pages, Nikkei Digital Media, Inc.

(Continued)

*Primary Examiner* — Evan Pert
(74) *Attorney, Agent, or Firm* — Sughrue Mion, PLLC

(57) ABSTRACT

A light-emitting diode device includes a light-emitting diode, a power circuit portion for supplying electric power to the light-emitting diode, and a heat dissipating member for dissipating the heat generated from the light-emitting diode. The heat dissipating member is made of a thermal conductive sheet which contains a plate-like boron nitride particle. The thermal conductivity in a direction perpendicular to the thickness direction of the thermal conductive sheet is 4 W/m·K or more.

7 Claims, 11 Drawing Sheets

(56) References Cited

U.S. PATENT DOCUMENTS

| | | | |
|---|---|---|---|
| 8,120,056 B2* | 2/2012 | Yong et al. | 257/99 |
| 8,203,666 B2 | 6/2012 | Cho et al. | |
| 2002/0058743 A1 | 5/2002 | Tobita et al. | |
| 2002/0197923 A1 | 12/2002 | Tobita et al. | |
| 2004/0041257 A1 | 3/2004 | Tobita et al. | |
| 2005/0073846 A1* | 4/2005 | Takine | 362/296 |
| 2006/0092666 A1 | 5/2006 | Jeong et al. | |
| 2006/0165978 A1 | 7/2006 | Ito et al. | |
| 2007/0013067 A1 | 1/2007 | Nishida et al. | |
| 2007/0025108 A1* | 2/2007 | Kingsford et al. | 362/294 |
| 2007/0205706 A1 | 9/2007 | Yamada et al. | |
| 2007/0230173 A1 | 10/2007 | Kim | |
| 2007/0259211 A1 | 11/2007 | Wang | |
| 2008/0057333 A1 | 3/2008 | Chu et al. | |
| 2008/0128067 A1 | 6/2008 | Sayir et al. | |
| 2008/0224303 A1 | 9/2008 | Funakoshi et al. | |
| 2008/0271832 A1 | 11/2008 | Pieslak et al. | |
| 2009/0026484 A1 | 1/2009 | Hsu et al. | |
| 2009/0091045 A1* | 4/2009 | Tanikawa et al. | 257/791 |
| 2009/0161036 A1 | 6/2009 | Cho et al. | |
| 2010/0013086 A1 | 1/2010 | Obiraki et al. | |
| 2010/0063192 A1 | 3/2010 | Okubo et al. | |
| 2010/0110271 A1 | 5/2010 | Yanagita et al. | |
| 2010/0164362 A1 | 7/2010 | Miyakawa et al. | |
| 2010/0200801 A1 | 8/2010 | Ramasamy et al. | |
| 2010/0283001 A1 | 11/2010 | Pot et al. | |
| 2010/0301258 A1 | 12/2010 | Chen et al. | |
| 2010/0320892 A1* | 12/2010 | Yu | 313/46 |
| 2011/0192588 A1* | 8/2011 | Suzuki et al. | 165/185 |
| 2011/0199787 A1 | 8/2011 | Kim et al. | |
| 2011/0256569 A1* | 10/2011 | Holtzman | 435/25 |
| 2011/0259564 A1* | 10/2011 | Izutani et al. | 165/185 |
| 2011/0259565 A1 | 10/2011 | Izutani et al. | |
| 2011/0259566 A1* | 10/2011 | Izutani et al. | 165/185 |
| 2011/0259567 A1 | 10/2011 | Izutani et al. | |
| 2011/0259568 A1* | 10/2011 | Izutani et al. | 165/185 |
| 2011/0260185 A1 | 10/2011 | Izutani et al. | |
| 2011/0261242 A1 | 10/2011 | Izutani et al. | |
| 2011/0261535 A1* | 10/2011 | Izutani et al. | 361/708 |
| 2011/0262728 A1* | 10/2011 | Izutani et al. | 428/220 |
| 2011/0267557 A1 | 11/2011 | Izutani et al. | |
| 2012/0230043 A1* | 9/2012 | Kitagawa et al. | 362/382 |
| 2012/0285674 A1* | 11/2012 | Hirano | 165/185 |
| 2012/0286194 A1* | 11/2012 | Hirano | 252/73 |
| 2012/0306728 A1 | 12/2012 | Koyama et al. | |
| 2013/0120234 A1 | 5/2013 | Atkins | |

FOREIGN PATENT DOCUMENTS

| | | |
|---|---|---|
| JP | 2002-114575 | 4/2002 |
| JP | 2004-302067 | 10/2004 |
| JP | 2008-177917 | 7/2008 |
| JP | 2008-189818 | 8/2008 |
| JP | 2008-280436 | 11/2008 |
| JP | 2008-280496 | 11/2008 |
| JP | 2010-010469 | 1/2010 |
| WO | 2008/139968 A1 | 11/2008 |

OTHER PUBLICATIONS

U.S. Non-Final Office Action issued in U.S. Appl. No. 13/016,521 dated Nov. 6, 2012.
U.S. Non-Final Office Action issued in U.S. Appl. No. 13/016,616 dated Jul. 13, 2012.
Nihon Data Material, Ltd Web Site dated Jan. 14, 2011, http://www.demac.co.jp/products/denshi/html.
URL:http://www.ainex.jp/products/hm-02.htm (Jan. 14, 2011).
U.S. Non-Final Office Action issued in U.S. Appl. No. 13/016,685 dated Dec. 31, 2012.
"Polar Therm Boron Nitride Filler: PT110 Condensed Product Bulletin". Momentive Performance Materials Inc., (2012).
"Polar Therm Boron Nitride Filler: PT120 Condensed Product Bulletin". Momentive Performance Materials Inc., (2012).
U.S. Non-Final Office Action issued in U.S. Appl. No. 13/016,822 dated Jan. 31, 2013.
U.S. Non-Final Office Action issued in U.S. Appl. No. 13/016,507 dated Jan. 30, 2013.
U.S. Non-Final Office Action issued in U.S. Appl. No. 13/016,424 dated Jan. 30, 2013.
U.S. Non-Final Office Action issued in U.S. Appl. No. 13/016,726 dated Feb. 4, 2013.
U.S. Non-Final Office Action issued in U.S. Appl. No. 13/016,549 dated Feb. 4, 2013.
U.S. Non-Final Office Action issued in U.S. Appl. No. 13/016,467 dated Feb. 4, 2013.
H.W. Hill, Jr., D.G Brady. "Poly(arylene sulfide)s" May 15, 2008. Encyclopedia of Polymer Science and Technology. http://onlinelibrary.wiley.com/doi/10.1002/0471440264.pst246/abstract.
US Final Office Action issued in U.S. Appl. No. 13/016,521 dated Feb. 21, 2013.
U.S. Final Office Action issued in U.S. Appl. No. 13/016,467, dated Jul. 11, 2013.
U.S. Final Office Action issued in U.S. Appl. No. 13/016,507, dated Jul. 12, 2013.
U.S. Final Office Action issued in U.S. Appl. No. 13/016,424, dated Jul. 12, 2012.
U.S. Final Office Action issued in U.S. Appl. No. 13/016,726, dated Jul. 12, 2013.
U.S. Final Office Action issued in U.S. Appl. No. 13/016,549, dated Jul. 12, 2013.
U.S. Final Office Action issued in U.S. Appl. No. 13/016,822, dated Jul. 15, 2013.
U.S. Non-Final Office Action issued in U.S. Appl. No. 13/017,442, dated Jun. 18, 2013.
U.S. Final Office Action issued in U.S. Appl. No. 13/016,685, dated Jul. 16, 2013.
U.S. Non-Final Office Action issued in U.S. Appl. No. 13/016,521, dated Jul. 17, 2013.
US Notice of Allowance issued in U.S Appl. No. 13/016,616, dated May 30, 2013.
US Advisory Action issued in U.S. Appl. No. 13/016,521, dated May 30, 2013.

* cited by examiner

FIG.3
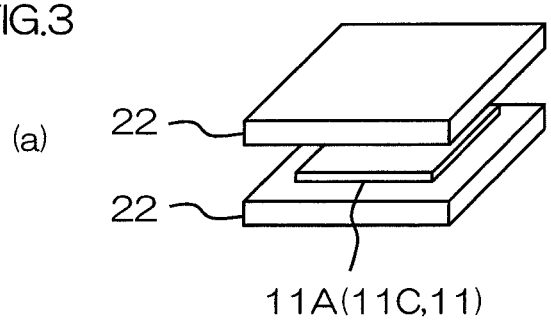
(a)
22
22
11A(11C,11)
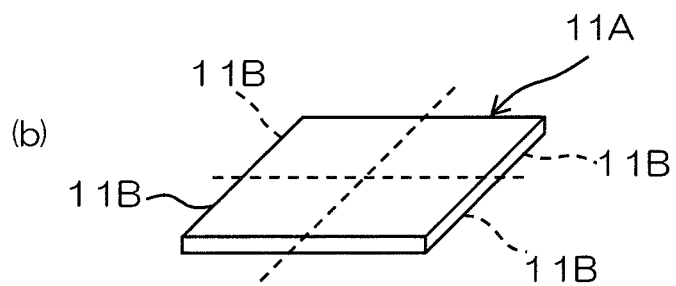
(b)
11B
11A
11B
11B
11B
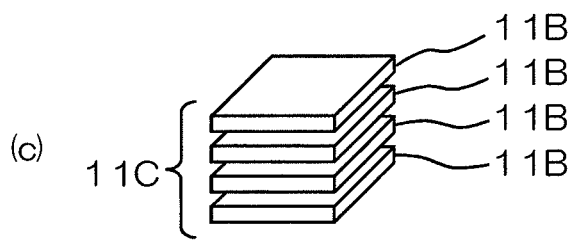
(c) 11C { 11B
11B
11B
11B FIG.7
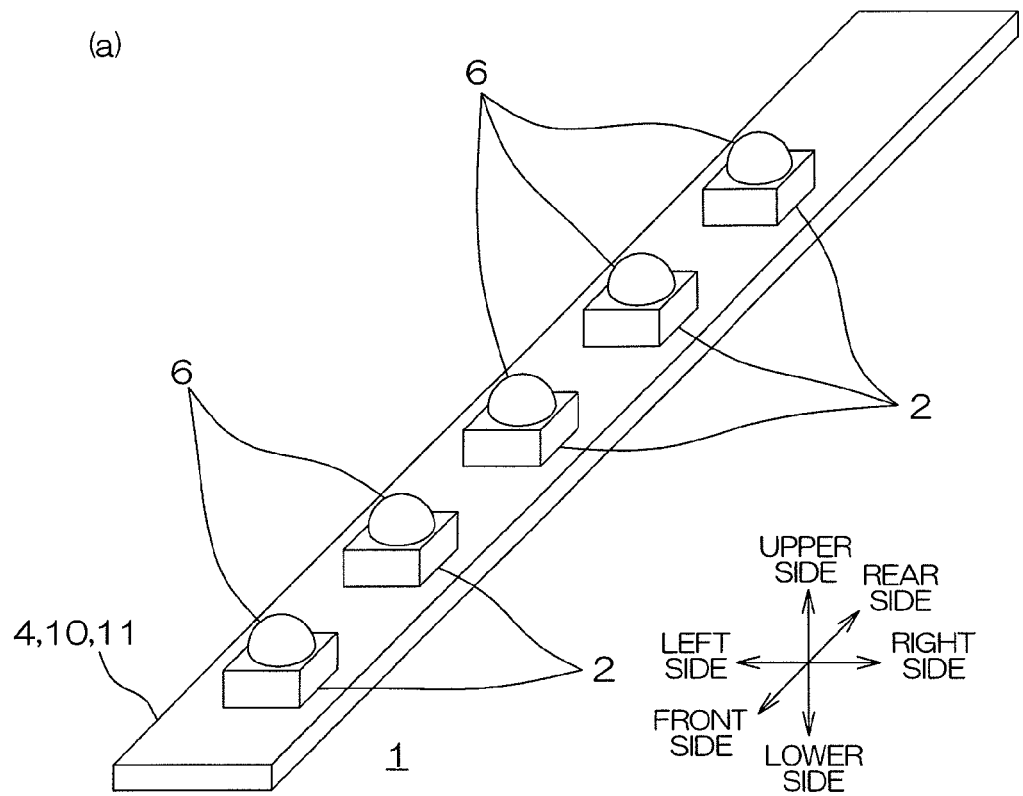
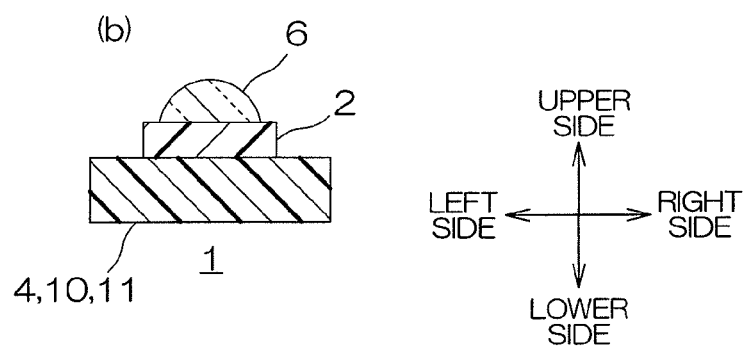

FIG.8
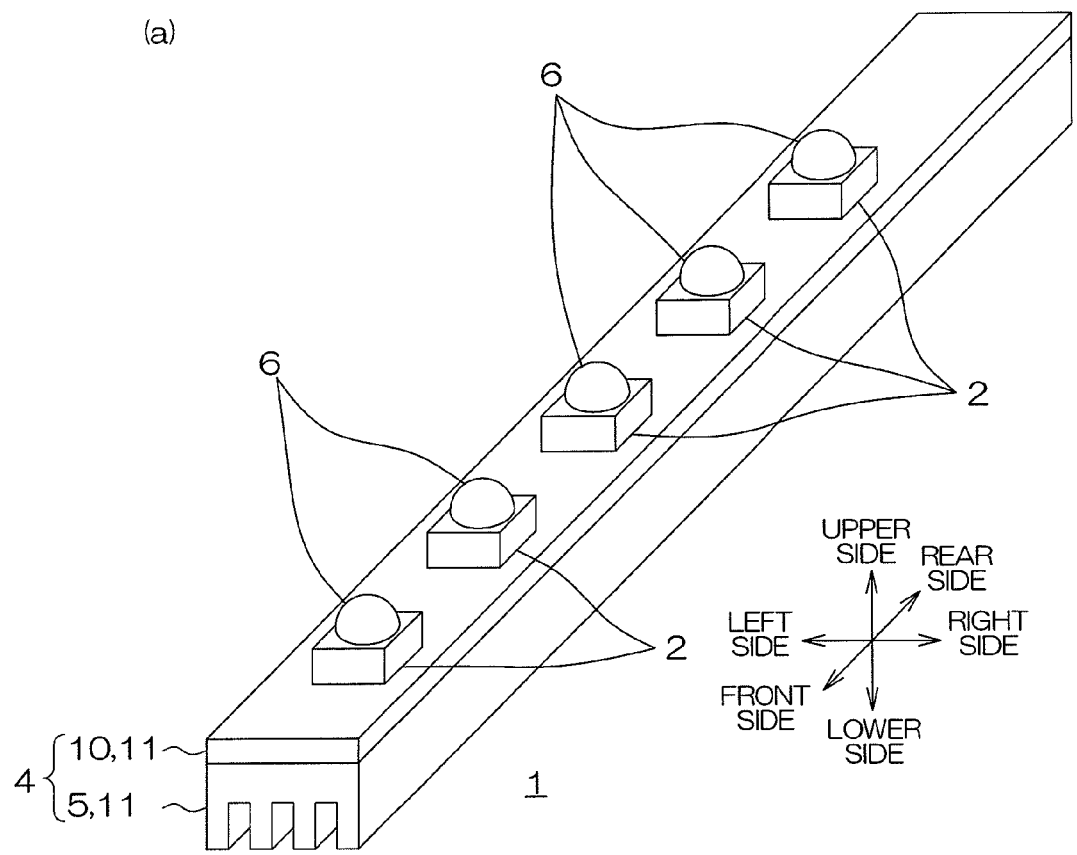
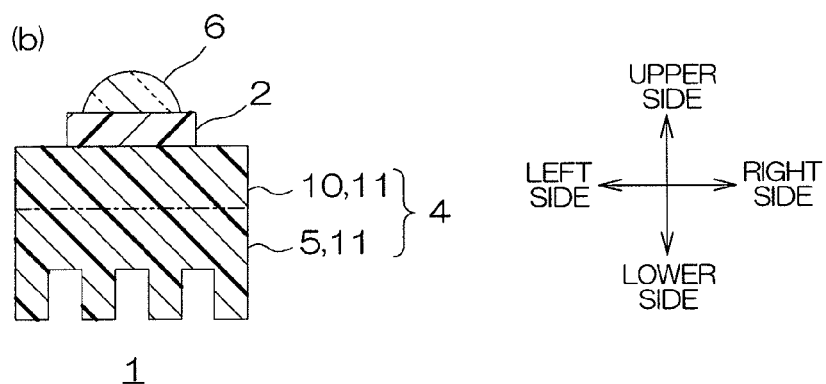

FIG.9
(a)
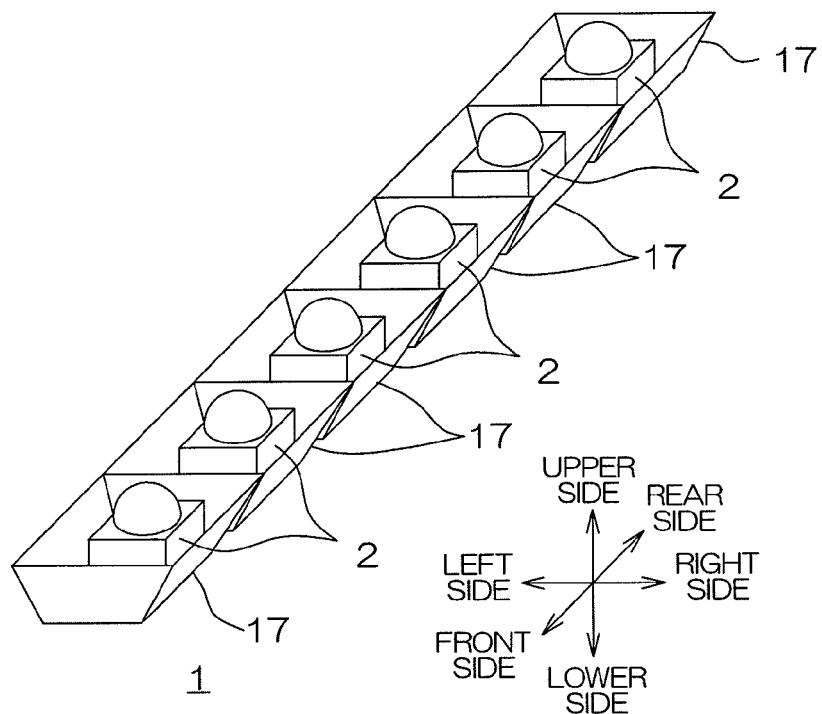
(b)
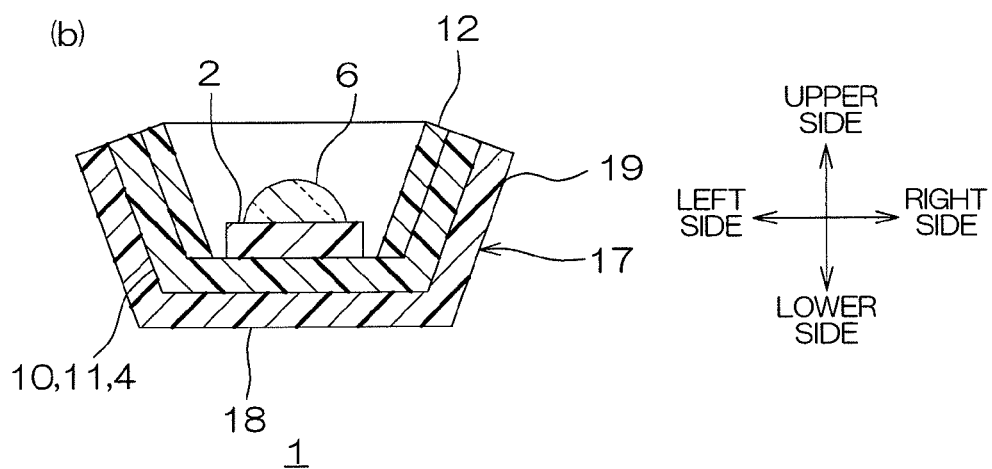

LIGHT-EMITTING DIODE DEVICE

CROSS-REFERENCE TO RELATED APPLICATION

The present application claims priority from Japanese Patent Applications No. 2010-018256 filed on Jan. 29, 2010; No. 2010-090908 filed on Apr. 9, 2010; No. 2010-172327 filed on Jul. 30, 2010; No. 2010-161850 filed on Jul. 16, 2010; and No. 2010-161848 filed on Jul. 16, 2010, the contents of which are hereby incorporated by reference into this application.

BACKGROUND OF THE INVENTION

1. Field of the Invention

The present invention relates to a light-emitting diode device.

2. Description of Related Art

In recent years, a light-emitting diode (LED) device has been widely known as a lighting device designed to prolong product life and to lower power consumption.

There has been proposed, for example, a LED bulb provided with a LED, a supporting member thereof, and a circuit which can be housed inside the supporting member (ref: for example, "Lead other companies with a LED bulb", the Internet at (http://it.nikkei.co.jp/business/news/index.aspx?n=MMIT2J000024112009)).

The supporting member proposed in the above-described document continuously includes a circular plate disposed below the LED and a fin disposed down below the circular plate. The supporting member is integrally formed of aluminum by die-cast molding.

When the light-emitting diode device becomes high in temperature by the heat generation of the LED, the luminous efficiency is reduced, so that the supporting member in the above-described document dissipates the heat generated from the LED from the fin via the circular plate.

SUMMARY OF THE INVENTION

However, since the supporting member in the above-described document is molded by die-cast molding, the accuracy of molding is low, so that a gap is caused between the upper surface of the circular plate and the lower surface of the LED and the heat generated from the LED cannot be efficiently dissipated via the supporting member.

Further, the supporting member is made of aluminum, so that the weight of LED bulb cannot be sufficiently reduced.

It is an object of the present invention to provide a light-emitting diode device capable of efficiently dissipating the heat generated from a light-emitting diode and of reducing the weight thereof.

The light-emitting diode device of the present invention includes a light-emitting diode, a power circuit portion for supplying electric power to the light-emitting diode, and a heat dissipating member for dissipating the heat generated from the light-emitting diode, wherein the heat dissipating member is made of a thermal conductive sheet which contains a plate-like boron nitride particle, and the thermal conductivity in a direction perpendicular to the thickness direction of the thermal conductive sheet is 4 W/m·K or more.

In the light-emitting diode device of the present invention, it is preferable that the heat dissipating member is disposed under the light-emitting diode in close contact with the light-emitting diode.

In the light-emitting diode device of the present invention, it is preferable that the heat dissipating member is/are a heat spreader for transferring the heat generated from the light-emitting diode and/or a heat sink for dissipating the heat generated from the light-emitting diode, and the heat dissipating member is an integral molding product of the heat spreader and the heat sink.

In the light-emitting diode device of the present invention, it is preferable that the heat dissipating member serves as a light reflector for reflecting the light that the light-emitting diode emits.

In the light-emitting diode device of the present invention, the heat dissipating member is made of the thermal conductive sheet, thereby capable of coming into close contact with the light-emitting diode or a member near of it with a broad contact area. Therefore, the heat generated from the light-emitting diode can be efficiently dissipated along the direction perpendicular to the thickness direction of the thermal conductive sheet by the heat dissipating member.

As a result, it is possible to prevent a decrease in the luminous efficiency.

The heat dissipating member is made of the thermal conductive sheet which contains a boron nitride particle, so that the weight of the heat dissipating member and thus the light-emitting diode device can be reduced.

BRIEF DESCRIPTION OF THE DRAWINGS

FIG. 3 shows process drawings for describing a method for producing the thermal conductive sheet:
(a) illustrating a step of hot pressing a mixture or a laminated sheet,
(b) illustrating a step of dividing the pressed sheet into a plurality of pieces, and
(c) illustrating a step of laminating the divided sheets.

FIG. 7 shows another embodiment (embodiment in which light-emitting diodes are arranged in parallel and the heat dissipating member is the heat spreader) of the light-emitting diode device of the present invention:
(a) illustrating a perspective view,
(b) illustrating a sectional view.

FIG. 8 shows another embodiment (embodiment in which the light-emitting diodes are arranged in parallel and the heat dissipating member is the heat spreader and the heat sink) of the light-emitting diode device of the present invention:
(a) illustrating a perspective view,
(b) illustrating a sectional view.

FIG. 9 shows another embodiment (embodiment in which the light-emitting diodes are arranged in parallel and the heat dissipating member is the heat spreader) of the light-emitting diode device of the present invention:

(a) illustrating a perspective view,
(b) illustrating a sectional view.

Figure 10:
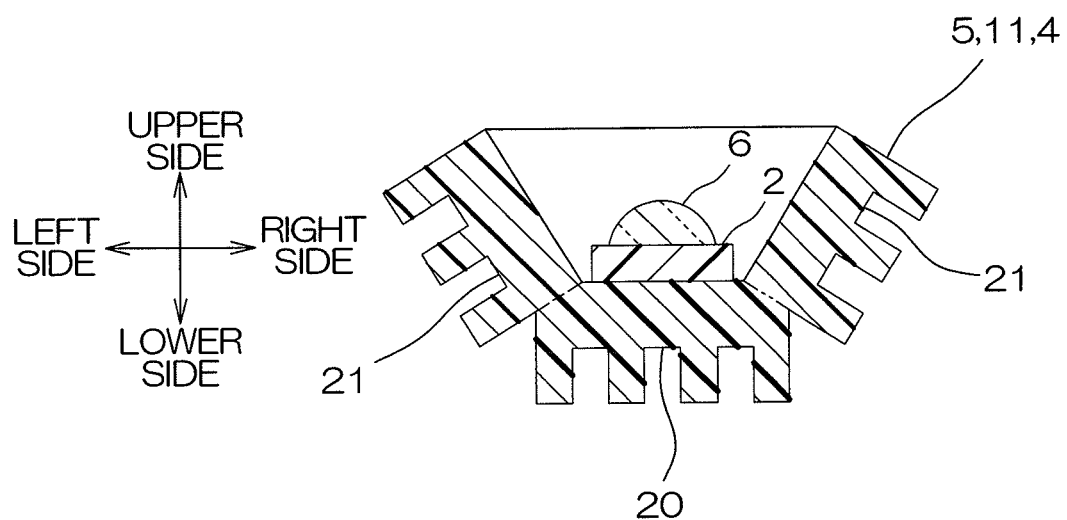

FIG. 10 shows a sectional view of another embodiment (embodiment in which the heat dissipating member is the heat sink) of the light-emitting diode device of the present invention.

Figure 11:
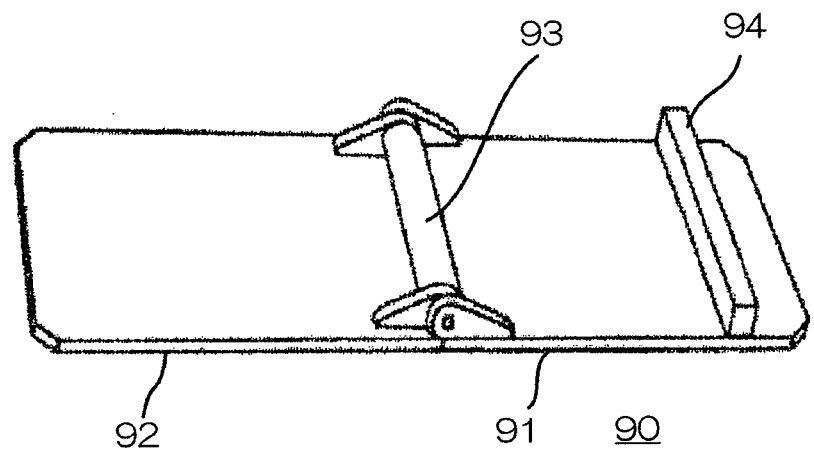

FIG. 11 shows a perspective view of a test device of type I in a bend resistance test (before the bend resistance test).

Figure 12:
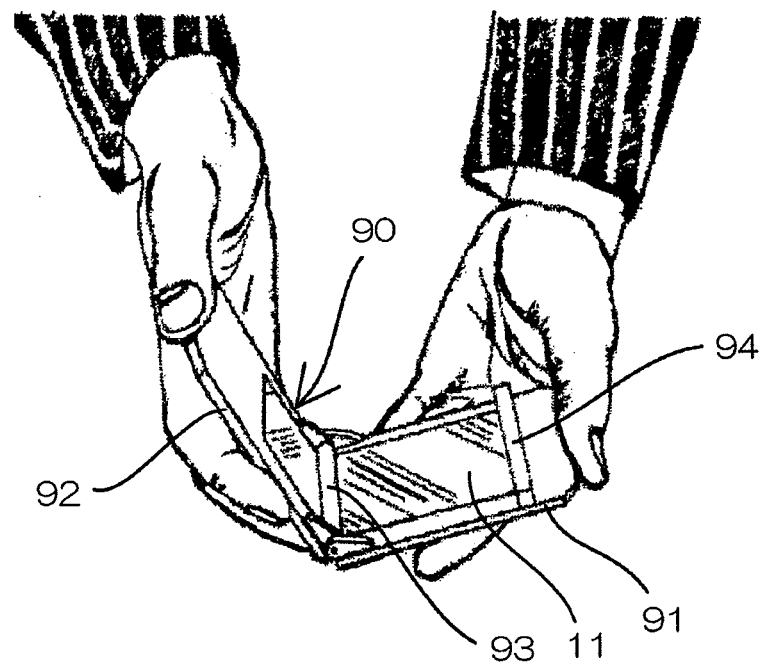

FIG. 12 shows a perspective view of a test device of type I in a bend resistance test (in the middle of the bend resistance test).

DETAILED DESCRIPTION OF PREFERRED EMBODIMENTS

Figure 1:
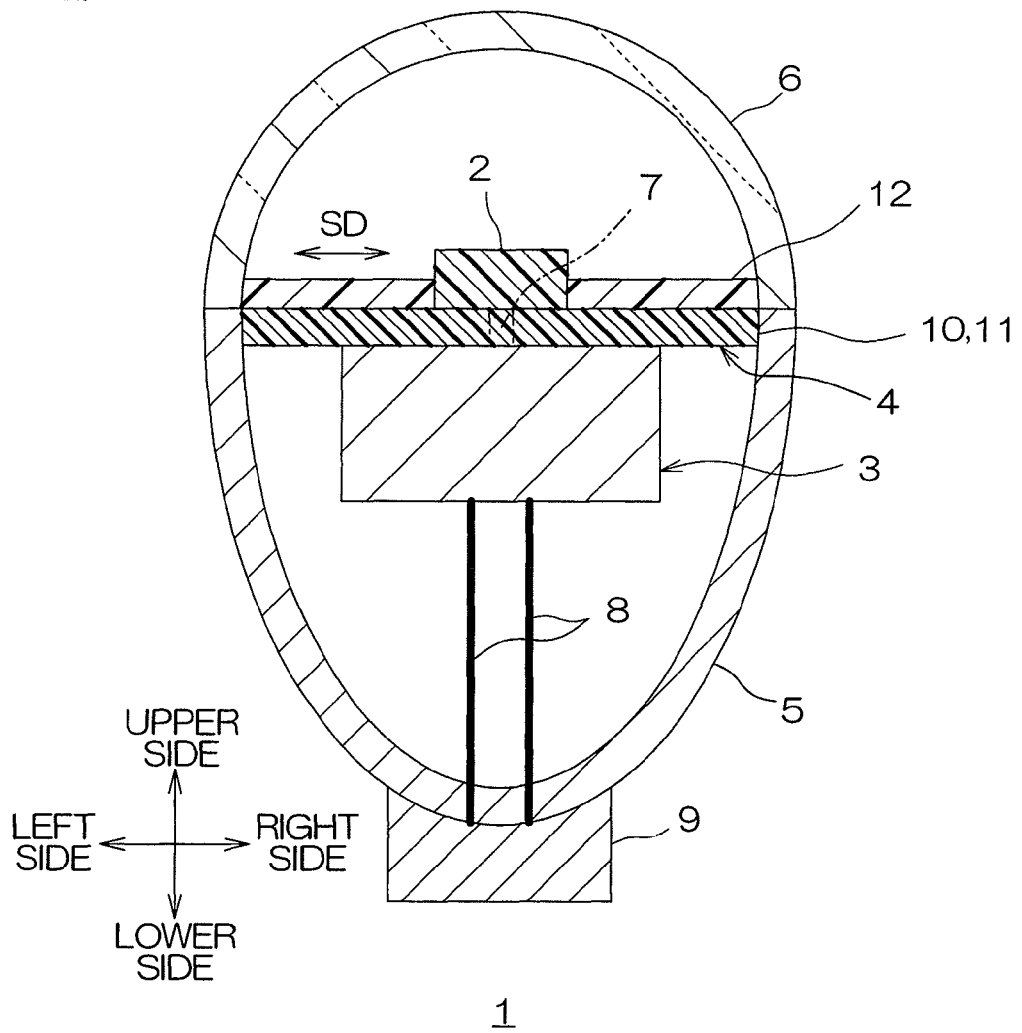
FIG. 1 shows a sectional view of an embodiment (embodiment in which a heat dissipating member is a heat spreader) of a light-emitting diode device of the present invention.
Figure 2:
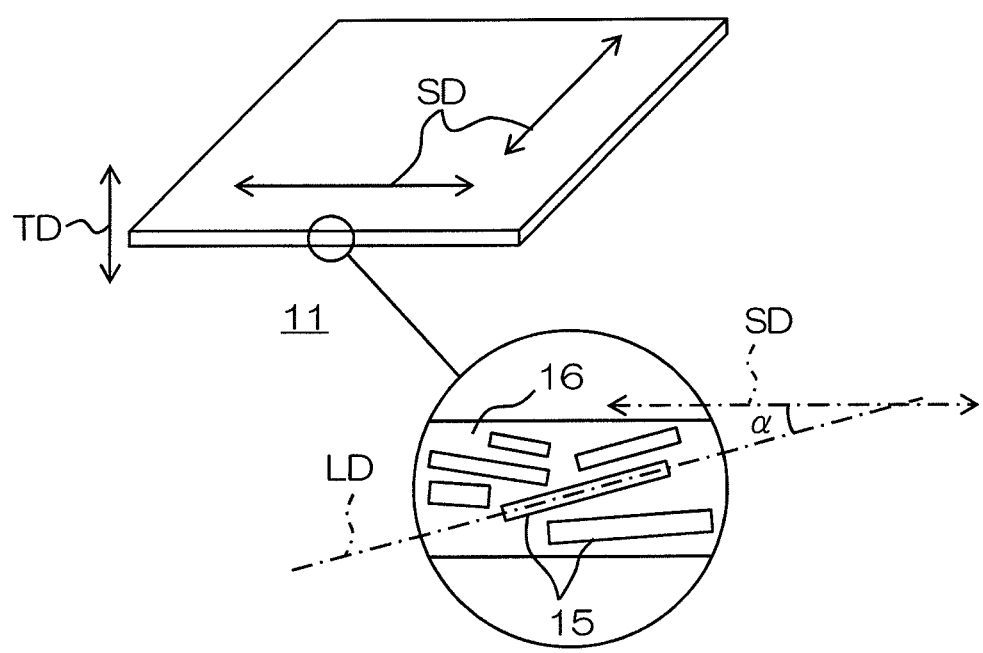
FIG. 2 shows a perspective view of a thermal conductive sheet.

FIG. 1 shows a sectional view of an embodiment (embodiment in which a heat dissipating member is a heat spreader) of a light-emitting diode device of the present invention. FIG. 2 shows a perspective view of a thermal conductive sheet. FIG. 3 shows process drawings for describing a method for producing the thermal conductive sheet.

In FIG. 1, a right-left direction of the paper is the right-left direction, an up-down direction of the paper being the up-down direction, and a depth direction of the paper being the front-rear direction. The directions of the drawings hereinafter conform to the directions described above.

In FIG. 1, a light-emitting diode device 1 includes a light-emitting diode 2, a power circuit portion 3, and a heat dissipating member 4. The light-emitting diode device 1 includes a heat sink 5, a light reflector 12, and a lens 6.

The light-emitting diode 2 is disposed substantially at the center of the light-emitting diode device 1 and is formed into a generally rectangular shape in front sectional view expanding in the right-left direction and the front-rear direction. To be specific, an example of the light-emitting diode 2 includes a white light-emitting diode (white LED) which emits white light.

The power circuit portion 3 is provided so as to supply electric power to the light-emitting diode 2, disposed below the light-emitting diode 2, and to be specific, disposed to sandwich the heat dissipating member 4 down below the light-emitting diode 2 with the light-emitting diode 2. The power circuit portion 3 includes first wires 8 and second wires (not shown). While the first wires 8 are connected to a plug 9 which is connected to a power source (not shown), the second wires, which are not shown, are inserted into a first opening 7 (phantom lines, described later) of the heat dissipating member 4 to be connected to the light-emitting diode 2.

The heat dissipating member 4 is made of a thermal conductive sheet 11 (ref: FIG. 2) and is a heat spreader 10 for transferring the heat generated from the light-emitting diode 2 along a plane (surface) direction SD of the thermal conductive sheet 11 to be dissipated.

The heat spreader 10 is provided below the light-emitting diode 2 and to be specific, is disposed on the lower surface of the light-emitting diode 2 in close contact with the light-emitting diode 2. The heat spreader 10 is formed into a generally circular plate shape extending along the right-left direction and the front-rear direction. That is, the heat spreader 10 is formed by forming the thermal conductive sheet 11 into a generally circular plate shape.

To be specific, the thermal conductive sheet 11 contains boron nitride (BN) particles as an essential component, and further contains, for example, a resin component.

The boron nitride particles are formed into a plate-like (or flake-like) shape, and are dispersed so as to be orientated in a predetermined direction (described later) in the thermal conductive sheet 11.

The boron nitride particles have an average length in the longitudinal direction (maximum length in the direction perpendicular to the plate thickness direction) of, for example, 1 to 100 μm, or preferably 3 to 90 μm. The boron nitride particles have an average length in the longitudinal direction of, 5 μm or more, preferably 10 μm or more, more preferably 20 μm or more, even more preferably 30 μm or more, or most preferably 40 μm or more, and usually has an average length in the longitudinal direction of, for example, 100 μm or less, or preferably 90 μm or less.

The average thickness (the length in the thickness direction of the plate, that is, the length in the short-side direction of the particles) of the boron nitride particles is, for example, 0.01 to 20 μm, or preferably 0.1 to 15 μm.

The aspect ratio (length in the longitudinal direction/thickness) of the boron nitride particles is, for example, 2 to 10000, or preferably 10 to 5000.

The average particle size of the boron nitride particles as measured by a light scattering method is, for example, 5 μm or more, preferably 10 μm or more, more preferably 20 μm or more, particularly preferably 30 μm or more, or most preferably 40 μm or more, and usually is 100 μm or less.

The average particle size as measured by the light scattering method is a volume average particle size measured with a dynamic light scattering type particle size distribution analyzer.

When the average particle size of the boron nitride particles as measured by the light scattering method is below the above-described range, the thermal conductive sheet 11 may become fragile, and handleability may be reduced.

The bulk density (JIS K 5101, apparent density) of the boron nitride particles is, for example, 0.3 to 1.5 g/cm$^3$, or preferably 0.5 to 1.0 g/cm$^3$.

The specific gravity of the boron nitride particles is, for example, 2.1 to 2.3, or to be specific about 2.26.

As the boron nitride particles, a commercially available product or processed goods thereof can be used. Examples of commercially available products of the boron nitride particles include the "PT" series (for example, "PT-110") manufactured by Momentive Performance Materials Inc., and the "SHOBN®UHP" series (for example, "SHOBN®UHP-1") manufactured by Showa Denko K.K.

The resin component is a component that is capable of dispersing the boron nitride particles, i.e., a dispersion medium (matrix) in which the boron nitride particles are dispersed, including, for example, resin components such as a thermosetting resin component and a thermoplastic resin component.

Examples of the thermosetting resin component include epoxy resin, thermosetting polyimide, phenol resin, urea resin, melamine resin, unsaturated polyester resin, diallyl phthalate resin, silicone resin, and thermosetting urethane resin.

Examples of the thermoplastic resin component include polyolefin (for example, polyethylene, polypropylene, and ethylene-propylene copolymer), acrylic resin (for example, polymethyl methacrylate), polyvinyl acetate, ethylene-vinyl acetate copolymer, polyvinyl chloride, polystyrene, polyacrylonitrile, polyamide, polycarbonate, polyacetal, polyethylene terephthalate, polyphenylene oxide, polyphenylene sulfide, polysulfone, polyether sulfone, poly ether ether ketone, polyallyl sulfone, thermoplastic polyimide, thermoplastic urethane resin, polyamino-bismaleimide, polyamideimide, polyether-imide, bismaleimide-triazine resin, polymethylpentene, fluorine resin, liquid crystal polymer, olefin-vinyl alcohol copolymer, ionomer, polyarylate, acrylonitrile-ethylene-styrene copolymer, acrylonitrile-butadiene-styrene copolymer, and acrylonitrile-styrene copolymer.

These resin components can be used alone or in combination of two or more.

Of the thermosetting resin components, epoxy resin is preferably used.

The epoxy resin is in a state of liquid, semi-solid, or solid under normal temperature.

To be specific, examples of the epoxy resin include aromatic epoxy resins such as bisphenol epoxy resin (for example, bisphenol A epoxy resin, bisphenol F epoxy resin, bisphenol S epoxy resin, hydrogenated bisphenol A epoxy resin, dimer acid-modified bisphenol epoxy resin, and the like), novolak epoxy resin (for example, phenol novolak epoxy resin, cresol novolak epoxy resin, biphenyl epoxy resin, and the like), naphthalene epoxy resin, fluorene epoxy resin (for example, bisaryl fluorene epoxy resin and the like), and triphenylmethane epoxy resin (for example, trishydroxyphenylmethane epoxy resin and the like); nitrogen-containing-cyclic epoxy resins such as triepoxypropyl isocyanurate (triglycidyl isocyanurate) and hydantoin epoxy resin; aliphatic epoxy resin; alicyclic epoxy resin (for example, dicyclo ring-type epoxy resin and the like); glycidylether epoxy resin; and glycidylamine epoxy resin.

These epoxy resins can be used alone or in combination of two or more.

A combination of a liquid epoxy resin and a solid epoxy resin is preferable, or a combination of a liquid aromatic epoxy resin and a solid aromatic epoxy resin is even more preferable. To be specific, examples of such combinations include a combination of a liquid bisphenol epoxy resin and a solid triphenylmethane epoxy resin, or a combination of a liquid bisphenol epoxy resin and a solid bisphenol epoxy resin.

As an epoxy resin, preferably, a semi-solid epoxy resin is used alone, or more preferably, a semi-solid aromatic epoxy resin is used alone. Examples of those epoxy resins include, to be specific, a semi-solid fluorene epoxy resin.

A combination of a liquid epoxy resin and a solid epoxy resin, or a semi-solid epoxy resin improves conformability to irregularities (described later) of the thermal conductive sheet 11.

The epoxy resin has an epoxy equivalent of, for example, 100 to 1000 g/eqiv., or preferably 180 to 700 g/eqiv., and has a softening temperature (ring and ball test) of, for example, 80° C. or less (to be specific, 20 to 80° C.), or preferably 70° C. or less (to be specific, 25 to 70° C.).

The epoxy resin has a melt viscosity at 80° C. of, for example, 10 to 20000 mPa·s, or preferably 50 to 15000 mPa·s. When two or more epoxy resins are used in combination, the melt viscosity of the mixture of these epoxy resins is set within the above-described range.

Furthermore, when an epoxy resin that is solid under normal temperature and an epoxy resin that is liquid under normal temperature are used in combination, for example, a first epoxy resin having a softening temperature of below 45° C., or preferably below 35° C., and a second epoxy resin having a softening temperature of 45° C. or more, or preferably 55° C. or more are used in combination. In this way, the kinetic viscosity (in conformity with JIS K 7233, described later) of the resin component (mixture) can be set to a desired range, thereby improving conformability to irregularities (described later) of the thermal conductive sheet 11.

The epoxy resin can also be prepared as an epoxy resin composition containing, for example, an epoxy resin, a curing agent, and a curing accelerator.

The curing agent is a latent curing agent (epoxy resin curing agent) that can cure the epoxy resin by heating, and examples thereof include an imidazole compound, an amine compound, an acid anhydride compound, an amide compound, a hydrazide compound, and an imidazoline compound. In addition to the above-described compounds, a phenol compound, a urea compound, and a polysulfide compound can also be used.

Examples of the imidazole compound include 2-phenyl imidazole, 2-methyl imidazole, 2-ethyl-4-methyl imidazole, and 2-phenyl-4-methyl-5-hydroxymethyl imidazole.

Examples of the amine compound include aliphatic polyamines such as ethylene diamine, propylene diamine, diethylene triamine, triethylene tetramine, and aromatic polyamines such as metha phenylenediamine, diaminodiphenyl methane, and diaminodiphenyl sulfone.

Examples of the acid anhydride compound include phthalic anhydride, maleic anhydride, tetrahydrophthalic anhydride, hexahydrophthalic anhydride, 4-methyl-hexahydrophthalic anhydride, methyl nadic anhydride, pyromellitic anhydride, dodecenylsuccinic anhydride, dichloro succinic anhydride, benzophenone tetracarboxylic anhydride, and chlorendic anhydride.

Examples of the amide compound include dicyandiamide and polyamide.

An example of the hydrazide compound includes adipic acid dihydrazide.

Examples of the imidazoline compound include methylimidazoline, 2-ethyl-4-methylimidazoline, ethylimidazoline, isopropylimidazoline, 2,4-dimethylimidazoline, phenylimidazoline, undecylimidazoline, heptadecylimidazoline, and 2-phenyl-4-methylimidazoline.

These curing agents can be used alone or in combination of two or more.

A preferable example of the curing agent is an imidazole compound.

Examples of the curing accelerator include tertiary amine compounds such as triethylenediamine and tri-2,4,6-dimethylaminomethylphenol; phosphorus compounds such as triphenylphosphine, tetraphenylphosphoniumtetraphenylborate, and tetra-n-butylphosphonium-o,o-diethylphosphorodithioate; a quaternary ammonium salt compound; an organic metal salt compound; and derivatives thereof. These curing accelerators can be used alone or in combination of two or more.

In the epoxy resin composition, the mixing ratio of the curing agent is, for example, 0.5 to 50 parts by mass, or preferably 1 to 10 parts by mass per 100 parts by mass of the epoxy resin, and the mixing ratio of the curing accelerator is, for example, 0.1 to 10 parts by mass, or preferably 0.2 to 5 parts by mass per 100 parts by mass of the epoxy resin.

The above-described curing agent, and/or the curing accelerator can be prepared and used, as necessary, as a solution, i.e., the curing agent and/or the curing accelerator dissolved in a solvent; and/or as a dispersion liquid, i.e., the curing agent and/or the curing accelerator dispersed in a solvent.

Examples of the solvent include organic solvents including ketones such as acetone and methyl ethyl ketone, esters such as ethyl acetate, and amides such as N,N-dimethylformamide. Examples of the solvent also include aqueous solvents including water, and alcohols such as methanol, ethanol, propanol, and isopropanol. A preferable example is an organic solvent, and more preferable examples are ketones and amides.

Of the thermoplastic resin components, polyolefin is preferably used.

Preferable examples of polyolefin are polyethylene and ethylene-propylene copolymer.

Examples of polyethylene include a low density polyethylene and a high density polyethylene.

Examples of ethylene-propylene copolymer include a random copolymer, a block copolymer, or a graft copolymer of ethylene and propylene.

These polyolefins can be used alone or in combination of two or more.

The polyolefins have a weight average molecular weight and/or a number average molecular weight of, for example, 1000 to 10000.

The polyolefin can be used alone, or can be used in combination of two or more.

The resin component has a kinetic viscosity as measured in conformity with the kinetic viscosity test of JIS K 7233 (bubble viscometer method) (temperature: 25° C.±0.5° C., solvent: butyl carbitol, resin component (solid content) concentration: 40 mass %) of, for example, $0.22 \times 10^{-4}$ to $2.00 \times 10^{-4}$ $m^2/s$, preferably $0.3 \times 10^{-4}$ to $1.9 \times 10^{-4}$ $m^2/s$, or more preferably $0.4 \times 10^{-4}$ to $1.8 \times 10^{-4}$ $m^2/s$. The above-described kinetic viscosity can also be set to, for example, $0.22 \times 10^{-4}$ to $1.00 \times 10^{-4}$ $m^2/s$, preferably $0.3 \times 10^{-4}$ to $0.9 \times 10^{-4}$ $m^2/s$, or more preferably $0.4 \times 10^{-4}$ to $0.8 \times 10^{-4}$ $m^2/s$.

When the kinetic viscosity of the resin component exceeds the above-described range, excellent flexibility and conformability to irregularities (described later) may not be given to the thermal conductive sheet 11. On the other hand, when the kinetic viscosity of the resin component is below the above-described range, boron nitride particles may not be oriented in a predetermined direction.

In the kinetic viscosity test in conformity with JIS K 7233 (bubble viscometer method), the kinetic viscosity of the resin component is measured by comparing the bubble rising speed of a resin component sample with the bubble rising speed of criterion samples (having a known kinetic viscosity), and determining the kinetic viscosity of the criterion sample having a matching rising speed to be the kinetic viscosity of the resin component.

The specific gravity of the resin component is, for example, 1.0 to 1.5, or preferably 1.1 to 1.2.

In the thermal conductive sheet 11, the proportion of the volume-based boron nitride particle content (solid content, that is, the volume percentage of boron nitride particles relative to a total volume of the resin component and the boron nitride particles) is, for example, 35 vol % or more, preferably 60 vol % or more, or more preferably 75 vol % or more, and usually, for example, 95 vol % or less, or preferably 90 vol % or less.

When the proportion of the volume-based boron nitride particle content is below the above-described range, the boron nitride particles may not be oriented in a predetermined direction in the thermal conductive sheet 11. On the other hand, when the proportion of the volume-based boron nitride particle content exceeds the above-described range, the thermal conductive sheet 11 may become fragile, and handleability and conformability to irregularities (described later) may be reduced.

The mass-based mixing ratio of the boron nitride particles relative to 100 parts by mass of the total amount (total solid content) of the components (boron nitride particles and resin component) forming the thermal conductive sheet 11 is, for example, 40 to 95 parts by mass, or preferably 65 to 90 parts by mass, and the mass-based mixing ratio of the resin component relative to 100 parts by mass of the total amount of the components forming the thermal conductive sheet 11 is, for example, 5 to 60 parts by mass, or preferably 10 to 35 parts by mass. The mass-based mixing ratio of the boron nitride particles relative to 100 parts by mass of the resin component is, for example, 60 to 1900 parts by mass, or preferably 185 to 900 parts by mass.

When two epoxy resins (a first epoxy resin and a second epoxy resin) are used in combination, the mass ratio (mass of the first epoxy resin/mass of the second epoxy resin) of the first epoxy resin relative to the second epoxy resin can be set appropriately in accordance with the softening temperature and the like of the epoxy resins (the first epoxy resin and the second epoxy resin). For example, the mass ratio of the first epoxy resin relative to the second epoxy resin is 1/99 to 99/1, or preferably 10/90 to 90/10.

In the resin component, in addition to the above-described components (polymer), for example, a polymer precursor (for example, a low molecular weight polymer including oligomer), and/or a monomer are contained.

The specific gravity of the thermal conductive sheet 11 is, for example, 1.5 to 2.5, or preferably 1.7 to 2.3, or more preferably 1.9 to 2.1 since the boron nitride particles, to be specific, the boron nitride particles and the resin component are contained at the above-described ratio.

Next, a method for producing a thermal conductive sheet 11 is described with reference to FIG. 2 and FIG. 3.

In this method, first, the above-described components are blended at the above-described mixing ratio and are stirred and mixed, thereby preparing a mixture.

In the stirring and mixing, in order to mix the components efficiently, for example, the solvent may be blended therein with the above-described components, or, for example, the resin component (preferably, the thermoplastic resin component) can be melted by heating.

Examples of the solvent include the above-described organic solvents. When the above-described curing agent and/or the curing accelerator are prepared as a solvent solution and/or a solvent dispersion liquid, the solvent of the solvent solution and/or the solvent dispersion liquid can also serve as a mixing solvent for the stirring and mixing without adding a solvent during the stirring and mixing. Or, in the stirring and mixing, a solvent can be further added as a mixing solvent.

In the case when the stirring and mixing is performed using a solvent, the solvent is removed after the stirring and mixing.

To remove the solvent, for example, the mixture is allowed to stand at room temperature for 1 to 48 hours; heated at 40 to 100° C. for 0.5 to 3 hours; or heated under a reduced pressure atmosphere of, for example, 0.001 to 50 kPa, at 20 to 60° C., for 0.5 to 3 hours.

When the resin component is to be melted by heating, the heating temperature is, for example, a temperature in the neighborhood of or exceeding the softening temperature of the resin component, to be specific, 40 to 150° C., or preferably 70 to 140° C.

Next, in this method, the obtained mixture is hot-pressed.

To be specific, as shown in FIG. 3(a), as necessary, for example, the mixture is hot-pressed with two releasing films 22 sandwiching the mixture, thereby producing a pressed sheet 1A. Conditions for the hot-pressing are as follows: a temperature of, for example, 50 to 150° C., or preferably 60 to 140° C.; a pressure of, for example, 1 to 100 MPa, or preferably 5 to 50 MPa; and a duration of, for example, 0.1 to 100 minutes, or preferably 1 to 30 minutes.

More preferably, the mixture is hot-pressed under vacuum. The degree of vacuum in the vacuum hot-pressing is, for example, 1 to 100 Pa, or preferably 5 to 50 Pa, and the temperature, the pressure, and the duration are the same as those described above for the hot-pressing.

When the temperature, the pressure, and/or the duration in the hot-pressing is outside the above-described range, there may be a case where a porosity P (described later) of the thermal conductive sheet 11 cannot be adjusted to give a desired value.

The pressed sheet 1A obtained by the hot-pressing has a thickness of, for example, 50 to 1000 μm, or preferably 100 to 800 μm.

Next, in this method, as shown in FIG. 3(b), the pressed sheet 1A is divided into a plurality of pieces (for example, four pieces), thereby producing a divided sheet 1B (dividing step). In the division of the pressed sheet 1A, the pressed sheet 1A is cut along the thickness direction so that the pressed sheet 1A is divided into a plurality of pieces when the pressed sheet 1A is projected in the thickness direction. The pressed sheet 1A is cut so that the respective divided sheets 1B have the same shape when the divided sheets 1B are projected in the thickness direction.

Next, in this method, as shown in FIG. 3(c), the respective divided sheets 1B are laminated in the thickness direction, thereby producing a laminated sheet 1C (laminating step).

Thereafter, in this method, as shown in FIG. 3(a), the laminated sheet 1C is hot-pressed (preferably hot-pressed under vacuum) (hot-pressing step). The conditions for the hot-pressing are the same as the conditions for the hot-pressing of the above-described mixture.

The thickness of the hot-pressed laminated sheet 1C is, for example, 1 mm or less, or preferably 0.8 mm or less, and usually is, for example, 0.05 mm or more, or preferably 0.1 mm or more.

Thereafter, the series of the steps of the above-described dividing step (FIG. 3(b)), laminating step (FIG. 3(c)), and hot-pressing step (FIG. 3(a)) are performed repeatedly, so as to allow boron nitride particles 15 to be efficiently oriented in a predetermined direction in the resin component 16 in the thermal conductive sheet 11. The number of the repetition is not particularly limited, and can be set appropriately according to the charging state of the boron nitride particles. The number of the repetition is, for example, 1 to 10 times, or preferably 2 to 7 times.

In the above-described hot-pressing step (FIG. 3(a)), for example, a plurality of calendering rolls and the like can be used for rolling the mixture and the laminated sheet 1C.

The thermal conductive sheet 11 can be obtained in this manner.

The thickness of the obtained thermal conductive sheet 11 is, for example, 1 mm or less, or preferably 0.8 mm or less, and usually, for example, 0.05 mm or more, or preferably 0.1 mm or more.

In the thermal conductive sheet 11, the proportion of the volume-based boron nitride particle content (solid content, that is, volume percentage of boron nitride particles relative to the total volume of the resin component and the boron nitride particles) is, as described above, for example, 35 vol % or more (preferably 60 vol % or more, or more preferably 75 vol % or more), and usually 95 vol % or less (preferably 90 vol % or less).

When the proportion of the boron nitride particle content is below the above-described range, the boron nitride particles 15 may not be oriented in a predetermined direction in the thermal conductive sheet 11.

When the resin component 16 is the thermosetting resin component, for example, after the series of the steps of the above-described dividing step (FIG. 3(b)), laminating step (FIG. 3(c)), and hot-pressing step (FIG. 3(a)) are performed, the thermal conductive sheet 11 is obtained as it is in stage B.

In the thermal conductive sheet 11 thus obtained, as shown in FIG. 2 and its partially enlarged schematic view, a longitudinal direction LD of the boron nitride particle 15 is oriented efficiently along the plane direction SD that crosses (is perpendicular to) a thickness direction TD of the thermal conductive sheet 11.

The calculated average of the angle formed between the longitudinal direction LD of the boron nitride particle 15 and the plane direction SD of the thermal conductive sheet 11 (orientation angle α of the boron nitride particles 15 relative to the thermal conductive sheet 11) is, for example, 25 degrees or less, or preferably 20 degrees or less, and usually 0 degree or more.

The orientation angle α of the boron nitride particle 15 relative to the thermal conductive sheet 11 is obtained as follows: the thermal conductive sheet 11 is cut along the thickness direction with a cross section polisher (CP); the cross section thus appeared is photographed with a scanning electron microscope (SEM) at a magnification that enables observation of 200 or more boron nitride particles 15 in the field of view; a tilt angle α between the longitudinal direction LD of the boron nitride particle 15 and the plane direction SD (direction perpendicular to the thickness direction TD) of the thermal conductive sheet 11 is obtained from the obtained SEM photograph; and the average value of the tilt angles α is calculated.

Thus, the thermal conductivity in the plane direction SD of the thermal conductive sheet 11 is 4 W/m or more, preferably 5 W/m·K or more, more preferably 10 W/m·K or more, even more preferably 15 W/m·K or more, or particularly preferably 25 W/m·K or more, and usually 200 W/m·K or less.

The thermal conductivity in the plane direction SD of the thermal conductive sheet 11 is substantially the same before and after the curing by heat when the resin component 16 is the thermosetting resin component.

When the thermal conductivity in the plane direction SD of the thermal conductive sheet 11 is below the above-described range, thermal conductivity in the plane direction SD is insufficient, and therefore there may be a case where the thermal conductive sheet 11 cannot be used for heat dissipation that requires thermal conductivity in such a plane direction SD.

The thermal conductivity in the plane direction SD of the thermal conductive sheet 11 is measured by a pulse heating method. In the pulse heating method, the xenon flash analyzer "LFA-447" (manufactured by Erich NETZSCH GmbH & Co. Holding KG) is used.

The thermal conductivity in the thickness direction TD of the thermal conductive sheet 11 is, for example, 0.5 to 15 W/m·K, or preferably 1 to 10 W/m·K.

The thermal conductivity in the thickness direction TD of the thermal conductive sheet 11 is measured by a pulse heating method, a laser flash method, or a TWA method. In the pulse heating method, the above-described device is used, in the laser flash method, "TC-9000" (manufactured by Ulvac, Inc.) is used, and in the TWA method, "ai-Phase mobile" (manufactured by ai-Phase Co., Ltd) is used.

Thus, the ratio of the thermal conductivity in the plane direction SD of the thermal conductive sheet 11 relative to the thermal conductivity in the thickness direction TD of the thermal conductive sheet 11 (thermal conductivity in the plane direction SD/thermal conductivity in the thickness direction TD) is, for example, 1.5 or more, preferably 3 or more, or more preferably 4 or more, and usually 20 or less.

Although not shown in FIG. 2, for example, pores (gaps) are formed in the thermal conductive sheet 11.

The proportion of the pores in the thermal conductive sheet 11, that is, a porosity P, can be adjusted by setting the proportion of the boron nitride particle 15 content (volume-based), and further setting the temperature, the pressure, and/or the duration at the time of hot pressing the mixture of the boron nitride particle 15 and the resin component 16 (FIG. 2(a)). To be specific, the porosity P can be adjusted by setting the temperature, the pressure, and/or the duration of the hot pressing (FIG. 2(a)) within the above-described range.

The porosity P of the thermal conductive sheet 11 is, for example, 30 vol % or less, or preferably 10 vol % or less.

The porosity P is measured by, for example, as follows: the thermal conductive sheet 11 is cut along the thickness direction with a cross section polisher (CP); the cross section thus appeared is observed with a scanning electron microscope (SEM) at a magnification of 200 to obtain an image; the obtained image is binarized based on the pore portion and the non-pore portion; and the area ratio, i.e., the ratio of the pore portion area to the total area of the cross section of the thermal conductive sheet 11 is determined by calculation.

The thermal conductive sheet 11 has a porosity P2 after curing of, relative to a porosity P1 before curing, for example, 100% or less, or preferably 50% or less.

For the measurement of the porosity P (P1), when the resin component 16 is a thermosetting resin component, the thermal conductive sheet 11 before curing by heat is used.

When the porosity P of the thermal conductive sheet 11 is within the above-described range, the conformability to irregularities (described later) of the thermal conductive sheet 11 can be improved.

On the other hand, the thermal conductive sheet 11 does not fall off from an adherend in the initial adhesion test (1) described below. That is, a temporally fixed state between the thermal conductive sheet 11 and the adherend is kept.

Initial Adhesion Test (1): The thermal conductive sheet 11 is thermocompression bonded on top of an adherend that is placed along a horizontal direction to be temporary fixed thereon, allowed to stand for 10 minutes, and the adherend is turned over to be upside down.

Examples of the adherend include a substrate made of stainless steel (e.g., SUS 304 and the like), or a substrate made of the same material as that for the light-emitting diode 2.

In the pressure bonding, for example, while a sponge roll made of a resin such as silicone resin is pressed against the thermal conductive sheet 11, the sponge roll is rolled on the surface of the thermal conductive sheet 11.

The temperature of the thermocompression bonding is, when the resin component 16 is a thermosetting resin component (for example, epoxy resin), for example, 80° C.

On the other hand, when the resin component 16 is a thermoplastic resin component (for example, polyethylene), the temperature of the thermocompression bonding is a temperature higher by 10 to 30° C. than the softening point or the melting point of the thermoplastic resin component; preferably a temperature higher by 15 to 25° C. than the softening point or the melting point of the thermoplastic resin component; more preferably, a temperature higher by 20° C. than the softening point or the melting point of the thermoplastic resin component; or to be specific, a temperature of 120° C. (that is, the softening point or the melting point of the thermoplastic resin component is 100° C., and the temperature higher by 20° C. than 100° C. is 120° C.).

When the thermal conductive sheet 11 falls off from the adherend in the above-described initial adhesion test (1), that is, when the temporally fixed state between the thermal conductive sheet 11 and the adherend is not kept, there may be a case where the thermal conductive sheet 11 cannot be reliably temporally fixed to the adherend.

When the resin component 16 is a thermosetting resin component, the thermal conductive sheet 11 to be tested in the initial adhesion test (1) and the initial adhesion test (2) (described later) is a thermal conductive sheet 11 before curing, and the thermal conductive sheet 11 will be in B-stage based on the thermocompression bonding in the initial adhesion test (1) and the initial adhesion test (2).

When the resin component 16 is a thermoplastic resin component, the thermal conductive sheet 11 subjected to the initial adhesion test (1) and the initial adhesion test (2) (described later) is a solid thermal conductive sheet 11, and the thermal conductive sheet 11 is softened by the thermocompression bonding in the initial adhesion test (1) and the initial adhesion test (2).

Preferably, the thermal conductive sheet 11 does not fall off from the adherend in both of the above-described initial adhesion test (1) and the initial adhesion test (2) described below. That is, the temporally fixed state between the thermal conductive sheet 11 and the adherend is kept.

Initial Adhesion Test (2): the thermal conductive sheet 11 is thermocompression bonded on top of an adherend that is placed along a horizontal direction to be temporary fixed thereon, and then allowed to stand for 10 minutes, and thereafter, the adherend is disposed along a vertical direction (up-down direction).

The temperature in the thermocompression bonding of the Initial Adhesion Test (2) is the same as the temperature in the Initial Adhesion Test (1).

When the resin component 16 is a thermosetting resin component, the thermal conductive sheet 11 to be tested in the initial adhesion test (1) is a thermal conductive sheet 11 before curing, and the thermal conductive sheet 11 will be in B-stage based on the thermocompression bonding in the initial adhesion test (1).

When the resin component 16 is a thermoplastic resin component, the thermal conductive sheet 11 subjected to the initial adhesion test (1) and the initial adhesion test (2) (described later) is a solid thermal conductive sheet 11, and the thermal conductive sheet 11 is softened by the thermocompression bonding in the initial adhesion test (1) and the initial adhesion test (2).

In the thermal conductive sheet 11, the surface reflectance R with respect to the light of 500 nm is, for example, 70% or more, or preferably 75% or more, or more preferably 80% or more and usually 100% or less.

The surface reflectance R of the thermal conductive sheet 11 with respect to the light of 500 nm is the percentage when the surface reflectance of barium sulfate is 100%.

The surface reflectance R is measured by a spectral photometer. The measurement by the spectral photometer uses an integrating sphere and is performed with an incident angle of five degrees.

When the surface reflectance R of the thermal conductive sheet 11 is below the above-described range, there may be a case where the light of 500 nm emitted from the light-emitting diode 2 described later cannot be efficiently reflected.

In the thermal conductive sheet 11, when the resin component 16 is a thermosetting resin component, the surface reflectance R is the value of the thermal conductive sheet 11 after curing of it.

When the thermal conductive sheet 11 is evaluated in the bend test in conformity with the cylindrical mandrel method of JIS K 5600-5-1 under the test conditions shown below, preferably, no fracture is observed.

Test Conditions:
  Test Device: Type I
  Mandrel: diameter 10 mm
  Bending Angle: 90 degrees or more
  Thickness of the thermal conductive sheet 11: 0.3 mm FIGS. 11 and 12 show perspective views of the Type I test device. In the following, the Type I test device is described.

In FIGS. 11 and 12, a Type I test device 90 includes a first flat plate 91; a second flat plate 92 disposed in parallel with the first flat plate 91; and a mandrel (rotation axis) 93 provided for allowing the first flat plate 91 and the second flat plate 92 to rotate relatively.

The first flat plate 91 is formed into a generally rectangular flat plate. A stopper 94 is provided at one end portion (free end portion) of the first flat plate 91. The stopper 94 is formed on the surface of the first flat plate 91 so as to extend along the one end portion of the first flat plate 91.

The second flat plate 92 is formed into a generally rectangular flat plate, and one side thereof is disposed so as to be adjacent to one side (the other end portion (proximal end portion) that is opposite to the one end portion where the stopper 94 is provided) of the first flat plate 91.

The mandrel 93 is formed so as to extend along one side of the first flat plate 91 and of the second flat plate 92 that are adjacent to each other.

In the Type I test device 90, as shown in FIG. 11, the surface of the first flat plate 91 is flush with the surface of the second flat plate 92 before the start of the bend test.

To perform the bend test, the thermal conductive sheet 11 is placed on the surface of the first flat plate 91 and the surface of the second flat plate 92. The thermal conductive sheet 11 is placed so that one side of the thermal conductive sheet 11 is in contact with the stopper 94.

Then, as shown in FIG. 12, the first flat plate 91 and the second flat plate 92 are rotated relatively. In particular, the free end portion of the first flat plate 91 and the free end portion of the second flat plate 92 are rotated to a predetermined angle with the mandrel 93 as the center. To be specific, the first flat plate 91 and the second flat plate 92 are rotated so as to bring the surface of the free end portions thereof closer (oppose each other).

In this way, the thermal conductive sheet 11 is bent with the mandrel 93 as the center, conforming to the rotation of the first flat plate 91 and the second flat plate 92.

More preferably, no fracture is observed in the thermal conductive sheet 11 even when the bending angle is set to 180 degrees under the above-described test conditions.

When the resin component 16 is a thermosetting resin component, the thermal conductive sheet 11 which is subjected to the bend test is the semi-cured (in stage B) thermal conductive sheet 11 (that is, the thermal conductive sheet 11 before curing by heat).

When the fracture is observed in the bend test at the above-described bending angle in the thermal conductive sheet 11, there may be a case where excellent flexibility cannot be given to the thermal conductive sheet 11.

Furthermore, for example, when the thermal conductive sheet 11 is evaluated in the 3-point bending test in conformity with JIS K 7171 (2008) under the test conditions shown below, no fracture is observed.
  Test Conditions:
  Test piece: size 20 mm×15 mm
  Distance between supporting points: 5 mm
  Testing speed: 20 mm/min (indenter depressing speed)
  Bending angle: 120 degrees Evaluation method: presence or absence of fracture such as cracks at the center of the test piece is observed visually when tested under the above-described test conditions.

In the 3-point bending test, when the resin component 16 is a thermosetting resin component, the thermal conductive sheet 11 before curing by heat is used.

Therefore, the thermal conductive sheet 11 is excellent in conformability to irregularities because no fracture is observed in the above-described 3-point bending test. The conformability to irregularities is, when the thermal conductive sheet 11 is provided on an object with irregularities, a property of the thermal conductive sheet 11 that conforms to be in close contact with the irregularities.

A mark such as, for example, letters and symbols can adhere to the thermal conductive sheet 11. That is, the thermal conductive sheet 11 is excellent in mark adhesion. The mark adhesion is a property of the thermal conductive sheet 11 that allows reliable adhesion of the above-described mark thereon.

The mark can be adhered (applied, fixed, or firmly fixed) to the thermal conductive sheet 11, to be specific, by printing, engraving, or the like.

Examples of printing include, for example, inkjet printing, relief printing, intaglio printing, and laser printing.

When the mark is to be printed by inkjet printing, relief printing, or intaglio printing, for example, an ink fixing layer for improving mark's fixed state can be provided on the surface (printing side) of the thermal conductive sheet 11.

When the mark is to be printed by laser printing, for example, a toner fixing layer for improving mark's fixed state can be provided on the surface (printing side) of the thermal conductive sheet 11.

Examples of engraving include laser engraving, and punching.

The heat sink 5 is provided so as to dissipate the heat generated from the light-emitting diode 2 and is formed into a generally semi-elliptical shape in front sectional view extending long downward below the light-emitting diode 2. To be specific, the heat sink 5 is formed into a generally annular shape in plane sectional view in which the diameter is gradually reduced downward.

The heat sink 5 houses the power circuit portion 3 inside of it and is connected to the heat dissipating member 4 so as to expose the surface of the light-emitting diode 2 and the heat dissipating member 4.

To be specific, the upper end portion of the heat sink 5 is connected to the surrounding end portion of the heat dissipating member 4 so as to surround the heat dissipating member 4. That is, the inner circumference surface of the upper end portion of the heat sink 5 is in contact with the outer circumference surface of the heat dissipating member 4.

The plug 9 is provided at the lower end portion of the heat sink 5. The plug 9 is connected to the power circuit portion 3 via the first wires 8 passing through a second opening (not shown) which is formed at the lower end portion of the heat sink 5.

The heat sink 5 is made of a metal, such as aluminum, stainless steel, iron or copper.

The light reflector 12 is provided so as to reflect the light that the light-emitting diode 2 emits, formed into a flat plate sheet, and laminated on the upper surface of the heat dissipating member 4 exposed from the light-emitting diode 2 in close contact with the heat dissipating member 4. The light reflector 12 is formed of a sintered body of a ceramics material containing a light reflectivity material and the like.

The lens 6 is formed into a generally semi-sphere shape (generally dome shape) and is formed into a generally annular shape in plane sectional view in which the diameter is gradually reduced upward. The lower end surface of the lens 6 is provided on the upper end surface of the heat sink 5 so that the lens 6 covers the light-emitting diode 2 and the light reflector 12, and is fixed via a known adhesive layer (not shown). The inner circumference surface of the lower end portion of the lens 6 is in contact with the outer circumference surface of the light reflector 12. The lens 6 is formed of a transparent resin, such as silicone resin and the like.

To obtain the light-emitting diode device 1, for example, first fix the power circuit portion 3 inside the heat sink 5 via a frame, which is not shown, and then laminate the heat dissipating member 4 made of the semi-cured (in stage B) thermal conductive sheet 11 on the upper surface of the power circuit portion 3. At this time, the thermal conductive sheet 11 which is in stage B is excellent in flexibility, so that the thermal conductive sheet 11 comes into close contact with the upper surface of the power circuit portion 3 without any space. The thermal conductive sheet 11 comes into close contact with the inner circumference surface of the upper end portion of the heat sink 5 without any space as well.

The thermal conductive sheet 11 has been preliminarily cutout to have the size where the outer circumference surface thereof comes in contact with the inner circumference surface of the upper end portion of the heat sink 5 and to form the first opening 7 where the second wires, which are not shown, pass through is formed at the center thereof.

Next, the light-emitting diode 2 and the light reflector 12 are laminated on the upper surface of the heat dissipating member 4. The light-emitting diode 2 is laminated so as to be connected to the second wires which are not shown. The plug 9 is provided at the lower end portion of the heat sink 5 so as to be connected to the first wires 8.

At this time, the light-emitting diode 2 and the light reflector 12 come into close contact with the upper surface of the thermal conductive sheet 11 which is in stage B without any space.

Next, the lens 6 is fixed on the upper end surface of the heat sink 5 via an adhesive layer.

Thereafter, the thermal conductive sheet 11 which forms the heat dissipating member 4 is cured by heat (completely cured by heat).

Heating conditions to completely cure the thermal conductive sheet 11 by heat are as follows: a heating temperature of, for example, 60 to 250° C., or preferably 80 to 200° C. and a heating duration of, for example, 5 to 200 minutes.

The thermal conductive sheet 11 which is completely cured by heat is adhered to the lower surface of the light-emitting diode 2 and the light reflector 12, to the upper surface of the power circuit portion 3, and to the inner circumference surface of the upper end portion of the heat sink 5 without any space.

The light-emitting diode device 1 is obtained in this manner.

In the light-emitting diode device 1, the light-emitting diode 2 emits light by the electric power supplied from the power circuit portion 3.

At this time, the heat dissipating member 4 is made of the thermal conductive sheet 11 and is disposed in close contact with the light-emitting diode 2 with a broad contact area, so that the heat generated from the light-emitting diode 2 can be efficiently diffused along the plane direction SD of the thermal conductive sheet 11 by the heat dissipating member 4 which is the heat spreader 10.

In the light-emitting diode device 1, there is no need to separately fill a thermal conductive adhesive or a thermal conductive grease between the light-emitting diode 2 and the heat dissipating member 4. Further, the light-emitting diode 2 and the heat dissipating member 4 are in close contact with each other, so that the thermal resistance at the interface therebetween can be reduced, thereby capable of further improving heat dissipation easily with excellent workability (processability).

The heat diffused toward the plane direction SD by the heat dissipating member 4 is transferred to the heat sink 5 and is further dissipated therefrom.

As a result, it is possible to prevent a decrease in the luminous efficiency.

Furthermore, in the light-emitting diode device 1, the heat dissipating member 4 is made of the thermal conductive sheet 11 which contains a boron nitride particle, so that the weight of the heat dissipating member 4 and thus the light-emitting diode device 1 can be reduced.

In the above-described description, the light-emitting diode 2 is connected to the power circuit portion 3 by second wires, which are not shown, passing through the first opening 7. However, though not shown, a wiring pattern can be formed on the upper surface of the heat dissipating member 4 and the light-emitting diode 2 can be connected to the power circuit portion 3 via the wiring pattern. In that case, the wiring pattern is formed as a predetermined pattern on the upper surface of the heat dissipating member 4 after completely cured by heat.

Figure 4:
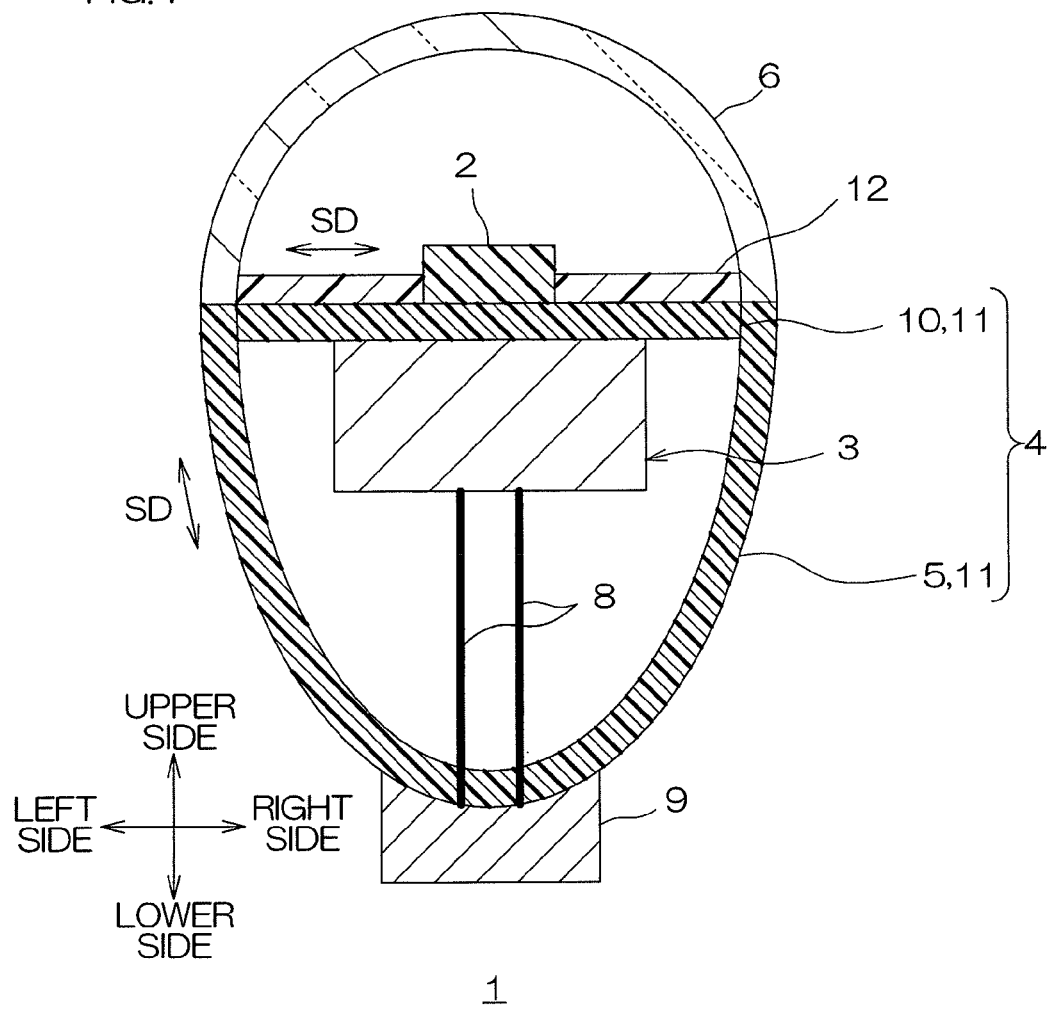
FIG. 4 shows a sectional view of another embodiment (embodiment in which the heat dissipating member is the heat spreader and a heat sink) of the light-emitting diode device of the present invention.
Figure 5:
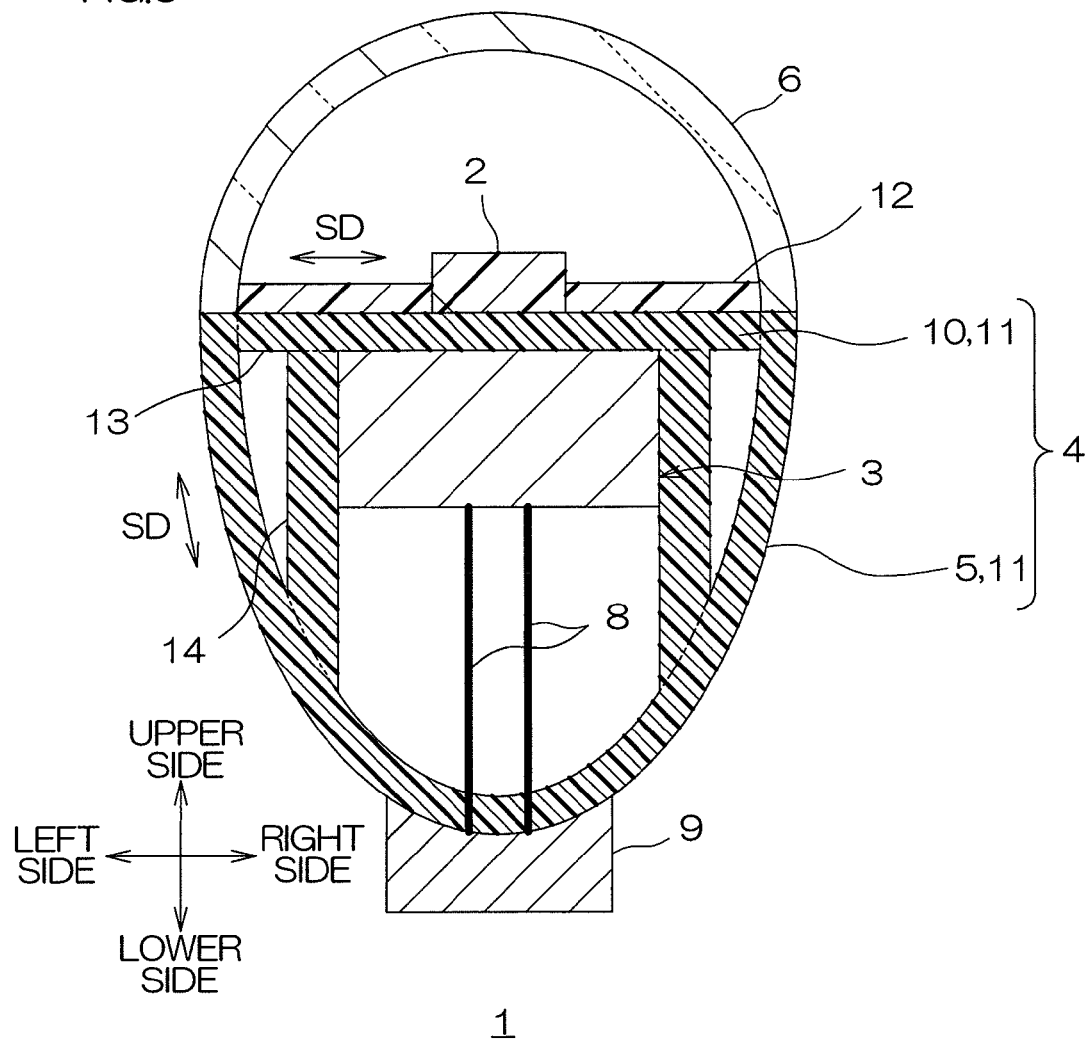
FIG. 5 shows a sectional view of another embodiment (embodiment in which the heat spreader and the heat sink are integrally molded) of the light-emitting diode device of the present invention.
Figure 6:
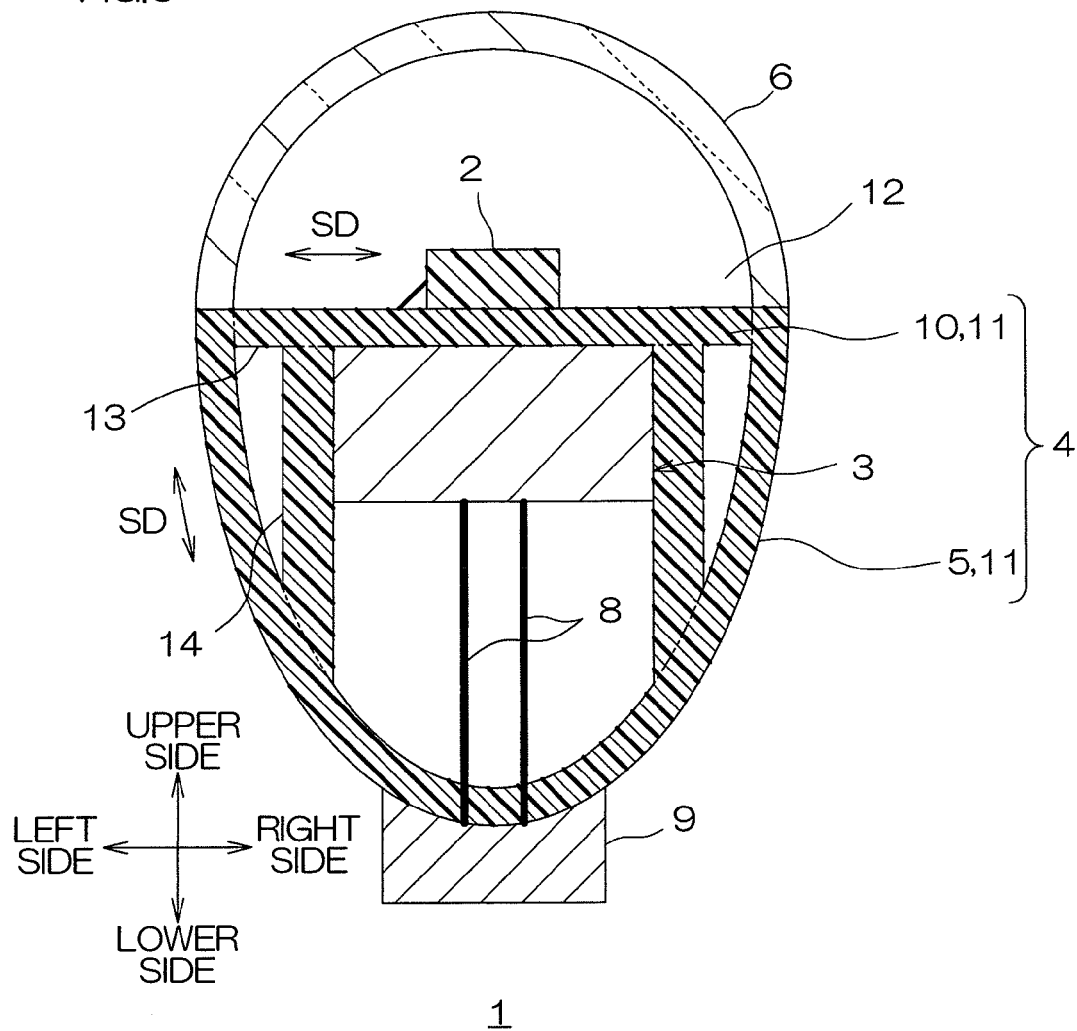
FIG. 6 shows a sectional view of another embodiment (embodiment in which the heat spreader serves as a light reflector) of the light-emitting diode device of the present invention.

FIG. 4 shows a sectional view of another embodiment (embodiment in which the heat dissipating member is the heat spreader and a heat sink) of the light-emitting diode device of the present invention. FIG. 5 shows a sectional view of another embodiment (embodiment in which the heat spreader and the heat sink are integrally molded) of the light-emitting diode device of the present invention. FIG. 6 shows a sectional view of another embodiment (embodiment in which the heat spreader serves as a light reflector) of the light-emitting diode device of the present invention. FIG. 7 shows a sectional view of another embodiment (embodiment in which light-emitting diodes are arranged in parallel and the heat dissipating member is the heat spreader) of the light-emitting diode device of the present invention. FIG. 8 shows another embodiment (embodiment in which the light-emitting diodes are arranged in parallel and the heat dissipating member is the heat spreader and the heat sink) of the light-emitting diode device of the present invention. FIG. 9 shows another embodiment (embodiment in which the light-emitting diodes are arranged in parallel and the heat dissipating member is the heat spreader) of the light-emitting diode device of the present invention. FIG. 10 shows a sectional view of another embodiment (embodiment in which the heat dissipating member is the heat sink) of the light-emitting diode device of the present invention.

In each figure to be described below, the same reference numerals are provided for members corresponding to each of those described above, and their detailed description is omitted. In FIG. 9, the heat spreader 10 and the light reflector 12 are omitted so as to clearly show the arrangement and the shape of the light-emitting diode 2 and a casing 17.

In the above-described description, the heat dissipating member 4 made of the thermal conductive sheet 11 is the heat spreader 10. However, as shown in FIGS. 4 to 6, it can be both of the heat spreader 10 and the heat sink 5.

In FIG. 4, the heat sink 5 is made of the thermal conductive sheet 11.

The heat sink 5 is formed into the above-described shape by allowing the plane direction SD of the thermal conductive sheet 11 (ref: FIG. 2) to wind around along the circumferential direction of the heat sink 5.

The heat sink 5 is prepared as the thermal conductive sheet 11 in stage B formed into the above-described shape before housing the power circuit portion 3. Thereafter, the heat sink 5 is cured by heat simultaneously with the curing by heat of the thermal conductive sheet 11 in stage B of the heat spreader 10.

As shown in FIGS. 5 and 6, for example, the heat spreader 10 and the heat sink 5 can be molded integrally.

In FIGS. 5 and 6, the heat spreader 10 integrally includes a circular plate portion 13 and a cylinder portion 14.

The circular plate portion 13 is formed into the same shape as that of the heat spreader 10 shown in FIG. 1.

The cylinder portion 14 extends from the middle of the radial direction on the lower surface of the circular plate portion 13 toward the middle of the up-down direction on the inner surface of the heat sink 5 and is formed so as to allow its axis to extend along the up-down direction. The cylinder portion 14 is disposed so as to surround the light-emitting diode 2 when projected in the up-down direction and is in contact with the outer circumference surface of the power circuit portion 3.

The circular plate portion 13, the cylinder portion 14, and the heat sink 5 are molded integrally. In FIGS. 5 and 6, although the boundary therebetween is shown in dashed lines for descriptive purposes so as to clearly show each of the members, the above-described boundary doesn't appear in practice.

To form the heat dissipating member 4, the cylinder portion 14, the circular plate portion 13, and the heat sink 5 are integrally molded from the thermal conductive sheet 11 in stage B and then are completely cured by heat at the same time.

In this way, the heat dissipating member 4 is an integral molding product of the heat spreader 10 and the heat sink 5, so that it is possible to prevent a gap from occurring between the heat spreader 10 and the heat sink 5, thereby capable of obtaining more excellent heat dissipation.

In the above-described description of FIGS. 1, 4, and 5, the light reflector 12 is provided. However, for example, as shown in FIG. 6, the circular plate portion 13 of the heat spreader 10 can serve as a light reflector without providing the light reflector 12.

That is, in FIG. 6, the thermal conductive sheet 11 which forms the heat spreader 10 has the above-described surface reflectance R, so that the circular plate portion 13 can function as a light reflector.

Therefore, the structure of the light-emitting diode device 1 can be made simple As shown in FIGS. 7 to 9, a plurality of the light-emitting diodes 2 can be arranged in parallel along the front-rear direction.

In FIGS. 7(a) and 7(b), the light-emitting diode device 1 includes a plurality of the light-emitting diodes 2, a power circuit portion (not shown) corresponding to each of the light-emitting diodes 2, the heat dissipating member 4 which is the heat spreader 10, and the lens 6 corresponding to each of the light-emitting diodes 2.

The heat spreader 10 is formed into a generally rectangular shape in plane view extending long in the front-rear direction.

The light-emitting diodes 2 are provided so as to come into close contact with the upper surface of the heat spreader 10 and a plurality thereof are arranged at spaced intervals to each other in the front-rear direction.

In the light-emitting diode device 1, above all, the heat spreader 10 can efficiently transfer the heat generated from each of the light-emitting diodes 2 along the front-rear direction.

In FIG. 8, the light-emitting diode device 1 is the one where the heat sink 5 is additionally provided in the light-emitting diode device 1 shown in FIG. 7.

As shown in FIGS. 8(a) and 8(b), the heat sink 5 is formed on the entire lower surface of the heat spreader 10 and the upper surface thereof is formed into a flat face and is formed into a generally comb shape in sectional view opening toward below.

In the light-emitting diode device 1, the heat spreader 10 can efficiently transfer the heat generated from the light-emitting diodes 2. Furthermore, the heat sink 5 can efficiently dissipate the heat.

As shown in FIG. 9, the heat spreader 10 which is the heat dissipating member 4 can be disposed along the casing 17.

As shown in FIGS. 9(a) and 9(b), the light-emitting diode device 1 includes the casing 17 which houses each of the light-emitting diodes 2, the heat spreader 10 laminated on the upper surface (inner surface) of the casing 17, the light-emitting diodes 2, the light reflector 12, and the lens 6.

The casing 17 is formed into a generally box shape with the upper side open, formed into a generally U-shape in front sectional view, and arranged in alignment in the front-rear direction.

Each of the casings 17 includes a bottom wall 18 and side walls 19 which extend upward from the circumference end portions of the bottom wall 18 so as to slant outward. Both end portions of the side walls 19 in the front-rear direction (except for the most front end portion and the most end portion) are in contact with each other.

The heat spreader 10 which is the heat dissipating member 4 is continuously laminated on the upper surface of the bottom wall 18 and on the inner surfaces of the side walls 19.

The light-emitting diode 2 is disposed on the upper surface of the heat spreader 10 laminated on the upper surface of the bottom wall 18 in close contact with the heat spreader 10.

The light reflector 12 is provided around the light-emitting diode 2 and is laminated on the inner surfaces (side surfaces) of the heat spreader 10 which are laminated on the inner surfaces (side surfaces) of the side walls 19.

To obtain the light-emitting diode device 1, first dispose the thermal conductive sheet 11 in stage B on the upper surface of the above-described casing 17 and then dispose the light-emitting diode 2 and the light reflector 12 on the upper surface of the thermal conductive sheet 11. Subsequently, dispose the lens 6 thereon and then the thermal conductive sheet 11 is cured by heat. The thermal conductive sheet 11 is flexible, thereby capable of being easily laminated on the inner surface of the casing 17 corresponding to the shape of the casing 17.

In the light-emitting diode device 1, the heat spreader 10 transfers the heat generated from the light-emitting diode 2 and the casing 17 dissipates the heat.

As shown in FIG. 10, the heat sink 5 which is the heat dissipating member 4 can be used instead of the above-described casing 17, heat spreader 10, and light reflector 12.

In FIG. 10, the heat dissipating member 4 is the heat sink 5 and the heat sink 5 is molded integrally with a lower-side heat sink 20 which is disposed on the lower surface of the light-emitting diode 2 and outer-side heat sinks 21 which are disposed around the light-emitting diode 2.

The lower-side heat sink 20 is formed into a generally comb shape in sectional view with the upper surface thereof disposed in close contact with the lower surface of the light-emitting diode 2 and the lower side thereof open.

The outer-side heat sink 21 is formed so that the inner surface thereof becomes slanted outward as going upward. The outer-side heat sink 21 is formed into a generally comb shape in sectional view with the outer side open.

In the light-emitting diode device 1, the heat sink 5 dissipates the heat generated from the light-emitting diode 2.

EXAMPLES

While the present invention will be described hereinafter in further detail with reference to Prepared Examples and Examples, the present invention is not limited to these Prepared Examples and Examples.

(Preparation of a Thermal Conductive Sheet)

Prepared Example 1

The components described below were blended, stirred, and allowed to stand at room temperature (23° C.) for one night, thereby allowing methyl ethyl ketone (dispersion medium for curing agent) to volatilize and preparing a semi-solid mixture. The details of the components were as follows: 13.42 g of PT-110 (trade name, plate-like boron nitride particles, average particle size (light scattering method) 45 µm, manufactured by Momentive Performance Materials Inc.); 1.0 g of jER® 828 (trade name, bisphenol A epoxy resin, the first epoxy resin, liquid, epoxy equivalent 184 to 194 g/eqiv., softening temperature (ring and ball test) below 25° C., melt viscosity (80° C.) 70 mPa·s, manufactured by Japan Epoxy Resins Co., Ltd.); 2.0 g of EPPN-501HY (trade name, triphenylmethane epoxy resin, the second epoxy resin, solid, epoxy equivalent 163 to 175 g/eqiv., softening temperature (ring and ball test) 57 to 63° C., manufactured by NIPPON KAYAKU Co., Ltd.); and 3 g (solid content 0.15 g) (5 mass % relative to the total volume of jER® 828 and EPPN-501HY which are epoxy resins) of Curing Agent (a dispersion of 5 mass % Curezol® 2P4MHZ-PW (trade name, 2-phenyl-4-methyl-5-hydroxymethyl imidazole, manufactured by Shikoku Chemicals Corporation) in methyl ethyl ketone).

In the above-described mixing formulation, the volume percentage (vol %) of the boron nitride particles relative to the total volume of the solid content excluding the curing agent (that is, the solid content of the boron nitride particles and epoxy resin) was 70 vol %.

Next, the obtained mixture was sandwiched by two silicone-treated releasing films, and then these were hot-pressed with a vacuum hot-press at 80° C. under an atmosphere (vacuum atmosphere) of 10 Pa with a load of 5 ton (20 MPa) for 2 minutes. A pressed sheet having a thickness of 0.3 mm was thus obtained (ref: FIG. 2(a)).

Thereafter, the obtained pressed sheet was cut so as to be divided into a plurality of pieces when projected in the plane direction of the pressed sheet. Divided sheets were thus obtained (ref: FIG. 2(b)). Next, the divided sheets were laminated in the thickness direction. A laminated sheet was thus obtained (ref: FIG. 2(c)).

Then, the obtained laminated sheet was hot-pressed under the same conditions as described above with the above-described vacuum hot-press (ref: FIG. 2(a)).

Then, a series of the above-described operations of cutting, laminating, and hot-pressing (ref: FIG. 2) was repeated four times. A thermal conductive sheet having a thickness of 0.3 mm (in stage B) was thus obtained (ref: FIG. 3).

Prepared Examples 2 to 16

Thermal conductive sheets (Prepared Examples 2 to 16) were obtained in the same manner as in Prepared Example 1 in accordance with the mixing ratio and production conditions of Tables 1 to 3 (ref: FIG. 3).

(Production of a Light-Emitting Diode Device)

Example 1

A first opening was formed at the center of a thermal conductive sheet in stage B obtained in Prepared Example 1 and the thermal conductive sheet was cutout to have the size described above. Next the thermal conductive sheet was laminated on the upper surface of a power circuit portion in close contact with the power circuit portion, and then a light-emitting diode and a light reflector were laminated on the upper surface of the thermal conductive sheet in close contact with the thermal conductive sheet. Thereafter, the power circuit portion and the light-emitting diode were connected via second wires passing through the first opening.

Subsequently, a heat spreader which was made of the thermal conductive sheet and was a heat dissipating member was formed by curing the thermal conductive sheet by heat (completely curing by heat) at 150° C. for 120 minutes. The heat spreader was adhered to the light-emitting diode, the light reflector, and the power circuit portion (ref: FIG. 1).

Examples 2 to 16

The heat spreaders (Examples 2 to 16) made of thermal conductive sheets were formed in the same manner as in Example 1 except that each of the thermal conductive sheets of Prepared Examples 2 to 16 was used instead of the thermal conductive sheet of Prepared Example 1.

Each of the heat spreaders of Examples 2 to 16 was adhered to the light-emitting diode, the light reflector, and the power circuit portion (ref: FIG. 1).

(Evaluation)

1. Thermal Conductivity

The thermal conductivity of the thermal conductive sheets of Prepared Examples 1 to 16 was measured.

That is, the thermal conductivity in the plane direction (SD) was measured by a pulse heating method using a xenon flash analyzer "LFA-447" (manufactured by Erich NETZSCH GmbH & Co. Holding KG).

The results are shown in Tables 1 to 3.

2. Heat Dissipation

When operating the light-emitting diode devices of Examples 1 to 16, the surface temperature of the heat spreader was measured by an infrared camera. As a result, it was confirmed that a rise in temperature was prevented in Examples 1 to 16.

Therefore, it was confirmed that heat dissipation of the heat dissipating members of Examples 1 to 16 was excellent.

3. Specific Gravity

The specific gravity of the thermal conductive sheets of Prepared Examples 1 to 16 was measured.

The results are shown in Tables 1 to 3.

It was confirmed that the specific gravity of each of the thermal conductive sheets is within the range of 1.6 to 2.1, being smaller than that of aluminum, which is 2.7, so that the weight thereof was reduced.

4. Initial Adhesion Test 4-1. Initial Adhesion Test for Mounting Substrate for Notebook PC Initial adhesion tests (1) and (2) of the uncured thermal conductive sheet in Prepared Examples 1 to 16 to a mounting substrate for notebook PC on which a plurality of electronic components are mounted were conducted.

That is, the thermal conductive sheet was temporally fixed to the surface (the side on which the electronic components are mounted) along the horizontal direction of the mounting substrate for notebook PC using a sponge roll made of silicone resin by thermocompression bonding at 80° C. (Prepared Examples 1 to 9 and Prepared Examples 11 to 16) or 120° C. (Prepared Example 10), and then allowed to stand for 10 minutes, and thereafter, the mounting substrate for notebook PC was disposed along the up-down direction (Initial Adhesion Test (2)).

Afterwards, the mounting substrate for notebook PC was positioned so that the thermal conductive sheet faces downward (that is, turned over to be upside down from the position of the temporally fixing) (Initial Adhesion Test (1)).

Then, in the above-described Initial Adhesion Test (1) and Initial Adhesion Test (2), the thermal conductive sheet was evaluated based on the criteria below. The results are shown in Tables 1 to 3.

<Criteria>

Good: It was confirmed that the thermal conductive sheet did not fall off from the mounting substrate for notebook PC.

Bad: It was confirmed that the thermal conductive sheet fell off from the mounting substrate for notebook PC.

4-2. Initial Adhesion Test to Stainless Steel Substrate

Initial adhesion tests (1) and (2) were conducted in the same manner as described above for adhesion of the uncured thermal conductive sheet of Prepared Examples 1 to 16 to a stainless steel substrate (made of SUS 304).

Then, in the above-described Initial Adhesion Test (1) and Initial Adhesion Test (2), the thermal conductive sheet was evaluated based on the criteria below. The results are shown in Tables 1 to 3.

<Criteria>

Good: It was confirmed that the thermal conductive sheet did not fall off from the stainless steel substrate.

Bad: It was confirmed that the thermal conductive sheet fell off from the stainless steel substrate.

5. Reflectance

The surface reflectance (R) of the thermal conductive sheets of Prepared Examples 1 to 16 with respect to the light of 500 nm was measured.

That is, the surface reflectance (R) was measured using a spectral photometer (U4100, manufactured by Hitachi High-Technologies Corporation) with an incident angle of five degrees. The surface reflectance (R) of the thermal conductive sheet was measured, using an integrating sphere, by allowing the reflectance of barium sulfate powder to be the criteria (that is, 100%) for the surface reflectance.

The results are shown in Tables 1 to 3.

6. Porosity (P)

The porosity (P1) of the uncured thermal conductive sheets of Prepared Examples 1 to 16 was measured by the following method.

Measurement method of porosity: The thermal conductive sheet was cut along the thickness direction with a cross section polisher (CP); and the cross section thus appeared was observed with a scanning electron microscope (SEM) at a magnification of 200. The obtained image was binarized based on the pore portion and the non-pore portion; and the area ratio, i.e., the ratio of the pore portion area to the total area of the cross section of the thermal conductive sheet was calculated.

The results are shown in Tables 1 to 3.

7. Conformability to Irregularities (3-point bending test)

The 3-point bending test in conformity with JIS K 7171 (2010) was carried out for the uncured thermal conductive sheets of Prepared Examples 1 to 16 with the following test conditions, thus evaluating conformability to irregularities with the following evaluation criteria. The results are shown in Tables 1 to 3.

Test Conditions:
  Test Piece: size 20 mm×15 mm
  Distance Between Supporting Points: 5 mm
  Testing Speed: 20 mm/min (indenter depressing speed)
  Bending Angle: 120 degrees
(Evaluation Criteria)
  Excellent: No fracture was observed.
  Good: Almost no fracture was observed.
  Bad: Fracture was clearly observed.

8. Printed Mark Visibility (Mark Adhesion by Printing: Mark Adhesion by Inkjet Printing or Laser Printing)

Marks were printed on the uncured thermal conductive sheets of Prepared Examples 1 to 16 by inkjet printing and laser printing, and the mark was observed.

As a result, it was confirmed that the mark was excellently visible in both cases of inkjet printing and laser printing, and that mark adhesion by printing was excellent in any of the thermal conductive sheets of Prepared Examples 1 to 16.

TABLE 1

| | | | | Average Particle Size (μm) | Prepared Example 1 | Prepared Example 2 | Prepared Example 3 | Prepared Example 4 | Prepared Example 5 | Prepared Example 6 |
|---|---|---|---|---|---|---|---|---|---|---|
| Mixing Formulation of Components | Boron Nitride Particles/g*A/ [vol %]*B/ [vol %]*C | | PT-110 [X1] | 45 | 13.42 [70] [69] | 3.83 [40] [38.8] | 5.75 [50] [48.8] | 12.22 [68] [66.9] | 23 [80] [79.2] | — |
| | | | UHP-1 [X2] | 9 | — | — | — | — | — | 12.22 [68] [66.9] |
| | Polymer | Thermosetting Resin | Epoxy resin Compositon | Epoxy Resin A [X3] (Semi-solid) | — | 3 | 3 | 3 | 3 | 3 |
| | | | | Epoxy Resin B [X4] (Liquid) | 1 | — | — | — | — | — |
| | | | | Epoxy Resin C [X5] (Solid) | — | — | — | — | — | — |
| | | | | Epoxy Resin D [X6] (Solid) | 2 | — | — | — | — | — |
| | | | | Curing Agent [X7] | — | 3 | 3 | 3 | 3 | 3 |

TABLE 1-continued

Table 1

| | | | Average Particle Size (μm) | Prepared Examples | | | | | |
|---|---|---|---|---|---|---|---|---|---|
| | | | | Prepared Example 1 | Prepared Example 2 | Prepared Example 3 | Prepared Example 4 | Prepared Example 5 | Prepared Example 6 |
| | | | (Solid Content in Grams) Curing Agent[X8] | | (0.15) | (0.15) | (0.15) | (0.15) | (0.15) |
| | | | (Solid Content in Grams) | 3 | — | — | — | — | — |
| | | Thermoplastic Resin | Polyethylene[X9] | (0.15) | — | — | — | — | — |
| Production Conditions | Heat Pressing | | Temperature (° C.) | 80 | 80 | 80 | 80 | 80 | 80 |
| | | | Number of Time(Times)*[D] | 5 | 5 | 5 | 5 | 5 | 5 |
| | | | Load (MPa)/(tons) | 20/5 | 20/5 | 20/5 | 20/5 | 20/5 | 20/5 |
| Evaluation | Thermal Conductive Layer | Thermal Conductivity (W/m · K) | Plane Direction (SD) | 30 | 4.5 | 6.0 | 30.0 | 32.5 | 17.0 |
| | | | Thickness Direction (TD) | 2.0 | 1.3 | 3.3 | 5.0 | 5.5 | 5.8 |
| | | | Ratio (SD/TD) | 15.0 | 3.5 | 1.8 | 6.0 | 5.9 | 2.9 |
| | | Specific Gravity | | 2.0 | 1.6 | 1.8 | 1.9 | 2.1 | 1.9 |
| | | Initial Adhesion Test | To Mounting Substrate for Notebook PC | Test (1) | Good | Good | Good | Good | Good | Good |
| | | | | Test (2) | Good | Good | Good | Good | Good | Good |
| | | | To Stainless Steel Substrate | Test (1) | Good | Good | Good | Good | Good | Good |
| | | | | Test (2) | Good | Good | Good | Good | Good | Good |
| | | Surface Reflectance (%) (Surface Reflectance to BaSo4) | | 83 | 71 | 72 | 80 | 90 | 73 |
| | | Porosity (vol %) | | 4 | 0 | 0 | 5 | 12 | 6 |
| | | Conformability to Irregularities/3-point Bending Test JIS K 7171 (2008) | | EXCELLENT | Good | Good | Good | Good | Good |
| | Boron Nitride Particles | Orientation Angle (α)(Degrees) | | 12 | 18 | 18 | 15 | 13 | 20 | g*[A]: Blended Weight
[vol %]*[B]: Percentage relative to the Total Volume of the Thermal Conductive Sheet (excluding curing agent)
[vol %]*[C]: Percentage relative to the Total Volume of the Thermal Conductive Sheet
Number of Time*[D]: Number of Time of Heat Pressing of the Laminated Sheet

TABLE 2

Table 2

| | | | | Average Particle Size (μm) | Prepared Examples | | | | |
|---|---|---|---|---|---|---|---|---|---|
| | | | | | Prepared Example 7 | Prepared Example 8 | Prepared Example 9 | Prepared Example 10 | Prepared Example 11 |
| Mixing Formulation of Components | Boron Nitride Particles/g*[A]/ [vol %]*[B]/ [vol %]*[C] | PT-110[X1] | | 45 | 12.22 [68] [66.9] | 12.22 [68] [66.9] | 12.22 [68] [66.9] | 3.83 [60] [60] | 13.42 [70] [69] |
| | Polymer | UHP-1[X2] | | 9 | — | — | — | — | — |
| | | Thermosetting Resin | Epoxy resin Composition | Epoxy Resin A[X3] (Semi-solid) | — | — | — | — | — |
| | | | | Epoxy Resin B[X4] (Liquid) | 1.5 | 3 | — | — | — |
| | | | | Epoxy Resin C[X5] (Solid) | 1.5 | — | 3 | — | — |
| | | | | Epoxy Resin D[X6] (Solid) | — | — | — | — | 3 |
| | | | | Curing Agent[X7] (Solid Content in Grams) | 3 (0.15) | 3 (0.15) | 3 (0.15) | — | 3 (0.15) |
| | | | | Curing Agent[X8] (Solid Content in Grams) | — | — | — | — | — |
| | | Thermoplastic Resin | | Polyethylene[X9] | — | — | — | 1 | — |
| Production Conditions | Heat Pressing | | Temperature (° C.) | | 80 | 80 | 80 | 120 | 80 |
| | | | Number of Time(Times)*[D] | | 5 | 5 | 5 | 5 | 5 |
| | | | Load (MPa)/(tons) | | 20/5 | 20/5 | 20/5 | 4/1 | 20/5 |
| Evaluation | Thermal Conductive Layer | Thermal Conductivity (W/m · K) | Plane Direction (SD) | | 30.0 | 30.0 | 30.0 | 20 | 24.5 |
| | | | Thickness Direction (TD) | | 5.0 | 5.0 | 5.0 | 2.0 | 2.1 |
| | | | Ratio (SD/TD) | | 6.0 | 6.0 | 6.0 | 10.0 | 11.7 |
| | | Specific Gravity | | | 2.0 | 2.0 | 1.9 | 1.8 | 2.0 |

TABLE 2-continued

| | | | Average Particle Size (μm) | | Prepared Examples | | | | |
|---|---|---|---|---|---|---|---|---|---|
| | | | | | Prepared Example 7 | Prepared Example 8 | Prepared Example 9 | Prepared Example 10 | Prepared Example 11 |
| | Initial Adhesion Test | To Mounting Substrate for Notebook PC | | Test (1) | Good | Good | Good | Good | Good |
| | | | | Test (2) | Good | Good | Good | Good | Good |
| | | To Stainless Steel Substrate | | Test (1) | Good | Good | Good | Good | Good |
| | | | | Test (2) | Good | Good | Good | Good | Good |
| | Surface Reflectance (%) (Surface Refectance to BaSo₄) | | | | 83 | 82 | 83 | 76 | 83 |
| | Porosity (vol %) | | | | 4 | 2 | 13 | 1 | 10 |
| | Conformability to Irregularities/3-point Bending Test JIS K 7171 (2008) | | | | Good | Good | Bad | Bad | Bad |
| Boron Nitride Particles | Orientation Angle (α)(Degrees) | | | | 15 | 16 | 16 | 15 | 16 | g*A: Blended Weight
[vol %]*B: Percentage relative to the Total Volume of the Thermal Conductive Sheet (excluding curing agent)
[vol %]*C: Percentage relative to the Total Volume of the Thermal Conductive Sheet
Number of Time*D: Number of Time of Heat Pressing of the Laminated Sheet

TABLE 3

| | | | | Average Particle Size (μm) | Prepared Examples | | | | |
|---|---|---|---|---|---|---|---|---|---|
| | | | | | Prepared Example 12 | Prepared Example 13 | Prepared Example 14 | Prepared Example 15 | Prepared Example 16 |
| Mixing Formulation of Components | Boron Nitride Particles/g*A/ [vol %]*B/ [vol %]*C | PT-110^X1 | | 45 | 3.83 [40] [37.7] | 13.42 [70] [69] | 13.42 [70] [69] | 13.42 [70] [69] | 13.42 [70] [69] |
| | | UHP-1^X2 | | 9 | — | — | — | — | — |
| | Polymer | Thermosetting Resin | Epoxy resin Compositon | Epoxy Resin A^X3 (Semi-solid) | 3 | 3 | 3 | 3 | 3 |
| | | | | Epoxy Resin B^X4 (Liquid) | — | — | — | — | — |
| | | | | Epoxy Resin C^X5 (Solid) | — | — | — | — | — |
| | | | | Epoxy Resin D^X6 (Solid) | — | — | — | — | — |
| | | | | Curing Agent^X7 (Solid Content in Grams) | 6 (0.3) | 3 (0.15) | 3 (0.15) | 3 (0.15) | 3 (0.15) |
| | | | | Curing Agent^X8 (Solid Content in Grams) | — | — | — | — | — |
| | | Thermoplastic Resin | | Polyethylene^X9 | — | — | — | — | — |
| Production Conditions | Heat Pressing | Temperature (° C.) | | | 80 | 60 | 70 | 80 | 80 |
| | | Number of Time(Times)*D | | | 5 | 5 | 5 | 5 | 5 |
| | | Load (MPa)/(tons) | | | 20/5 | 20/5 | 20/5 | 20/5 | 40/10 |
| Evaluation | Thermal Conductive Layer | Thermal Conductivity (W/m · K) | Plane Direction (SD) | | 4.1 | 10.5 | 11.2 | 32.5 | 50.7 |
| | | | Thickness Direction (TD) | | 1.1 | 2.2 | 3.0 | 5.5 | 7.3 |
| | | | Ratio (SD/TD) | | 3.7 | 4.8 | 3.7 | 5.9 | 6.9 |
| | | Specific Gravity | | | 1.6 | 1.8 | 1.8 | 1.9 | 2.0 |
| | | Initial Adhesion Test | To Mounting Substrate for Notebook PC | Test (1) | Good | Good | Good | Good | Good |
| | | | | Test (2) | Good | Good | Good | Good | Good |
| | | | To Stainless Steel Substrate | Test (1) | Good | Good | Good | Good | Good |
| | | | | Test (2) | Good | Good | Good | Good | Good |

TABLE 3-continued

Table 3

| | | Prepared Examples | | | | |
|---|---|---|---|---|---|---|
| | Average Particle Size (μm) | Prepared Example 12 | Prepared Example 13 | Prepared Example 14 | Prepared Example 15 | Prepared Example 16 |
| | Surface Reflectance (%) (Surface Refectance to BaSo4) | 72 | 81 | 81 | 83 | 82 |
| | Porosity (vol %) | 0 | 29 | 26 | 8 | 3 |
| | Conformability to Irregularities/3-point Bending Test JIS K 7171 (2008) | EXCELLENT | EXCELLENT | EXCELLENT | EXCELLENT | Good |
| Boron Nitride Particles | Orientation Angle (α)(Degrees) | 20 | 17 | 15 | 15 | 13 | g*[A]: Blended Weight
[vol %]*[B]: Percentage relative to the Total Volume of the Thermal Conductive Sheet (excluding curing agent)
[vol %]*[C]: Percentage relative to the Total Volume of the Thermal Conductive Sheet
Number of Time*[D]: Number of Time of Heat Pressing of the Laminated Sheet In Tables 1 to 3, values for the components are in grams unless otherwise specified.

In the rows of "boron nitride particles" in Tables 1 to 3, values on the top represent the blended weight (g) of the boron nitride particles; values in the middle represent the volume percentage (vol %) of the boron nitride particles relative to the total volume of the solid content excluding the curing agent in the thermal conductive sheet (that is, solid content of the boron nitride particles, and epoxy resin or polyethylene); and values at the bottom represent the volume percentage (vol %) of the boron nitride particles relative to the total volume of the solid content in the thermal conductive sheet (that is, solid content of boron nitride particles, epoxy resin, and curing agent).

For the components with "*" added in Tables 1 to 3, details are given below.

PT-110*[1]: trade name, plate-like boron nitride particles, average particle size (light scattering method) 45 μm, manufactured by Momentive Performance Materials Inc.

UHP-1*[2]: trade name: SHOBN®UHP-1, plate-like boron nitride particles, average particle size (light scattering method) 9 μm, manufactured by Showa Denko K. K.

Epoxy Resin A*[3]: OGSOL EG (trade name), bisarylfluorene epoxy resin, semi-solid, epoxy equivalent 294 g/eqiv., softening temperature (ring and ball test) 47° C., melt viscosity (80° C.) 1360 mPa·s, manufactured by Osaka Gas Chemicals Co., Ltd.

Epoxy Resin B*[4]: jER® 828 (trade name), bisphenol A epoxy resin, liquid, epoxy equivalent 184 to 194 g/eqiv., softening temperature (ring and ball test) below 25° C., melt viscosity (80° C.) 70 mPa·s, manufactured by Japan Epoxy Resins Co., Ltd.

Epoxy Resin C*[5]: jER® 1002 (trade name), bisphenol A epoxy resin, solid, epoxy equivalent 600 to 700 g/eqiv., softening temperature (ring and ball test) 78° C., melt viscosity (80° C.) 10000 mPa·s or more (measurement limit or more), manufactured by Japan Epoxy Resins Co., Ltd.

Epoxy Resin D*[6]: EPPN-501HY (trade name), triphenylmethane epoxy resin, solid, epoxy equivalent 163 to 175 g/eqiv., softening temperature (ring and ball test) 57 to 63° C., manufactured by NIPPON KAYAKU Co., Ltd.

Curing Agent*[7]: a solution of 5 mass % Curezol® 2PZ (trade name, manufactured by Shikoku Chemicals Corporation) in methyl ethyl ketone.

Curing Agent*[8]: a dispersion of 5 mass % Curezol® 2P4MHZ-PW (trade name, manufactured by Shikoku Chemicals Corporation) in methyl ethyl ketone.

Polyethylene*[9]: low density polyethylene, weight average molecular weight (Mw) 4000, number average molecular weight (Mn) 1700, melting point 100° C. to 105° C., manufactured by Sigma-Aldrich Co.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A light-emitting diode device comprising:
a light-emitting diode;
a power circuit portion for supplying electric power to the light-emitting diode; and
a heat dissipating member for dissipating the heat generated from the light-emitting diode, wherein
the heat dissipating member is made of a thermal conductive sheet which contains a plate-like boron nitride particle and a resin component;
in the thermal conductive sheet, the boron nitride particle is dispersed in a dispersion medium made of the resin component, and
the thermal conductivity in a direction perpendicular to the thickness direction of the thermal conductive sheet is 4 W/m·K or more.

2. The light-emitting diode device according to claim 1, wherein the heat dissipating member is disposed under the light-emitting diode in close contact with the light-emitting diode.

3. The light-emitting diode device according to claim 1, wherein the heat dissipating member is/are a heat spreader for transferring the heat generated from the light-emitting diode and/or a heat sink for dissipating the heat generated from the light-emitting diode.

4. The light-emitting diode device according to claim 1, wherein the heat dissipating member is an integral molding product of the heat spreader and the heat sink.

5. The light-emitting diode device according to claim 1, wherein the heat dissipating member serves as a light reflector for reflecting the light that the light-emitting diode emits.

6. The light-emitting diode device according to claim 1, wherein the resin component comprises an epoxy resin, and the epoxy resin is a combination of a liquid epoxy resin and a solid epoxy resin, or a semi-solid epoxy resin.

7. The light-emitting diode device according to claim 1, wherein in the thermal conductive sheet, a mass-based mixing ratio of the boron nitride particle is 65 to 90 parts by mass relative to 100 parts by mass of a total amount of the boron nitride particle and the resin component, and a mass-based mixing ratio of the resin component is 10 to 35 parts by mass relative to 100 parts by mass of a total amount of the boron nitride particle and the resin component.

* * * * *